(12) United States Patent
Nulman

(10) Patent No.: US 6,456,894 B1
(45) Date of Patent: *Sep. 24, 2002

(54) SEMICONDUCTOR PROCESSING TECHNIQUES

(75) Inventor: Jaim Nulman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/323,704

(22) Filed: Jun. 1, 1999

(51) Int. Cl.[7] .......................... G06F 19/00; H01L 21/00
(52) U.S. Cl. ............................ 700/121; 700/100; 438/5
(58) Field of Search .................... 700/99, 100, 106, 700/121, 179; 438/14, 5

(56) References Cited

U.S. PATENT DOCUMENTS

| | | | |
|---|---|---|---|
| 4,890,239 A | 12/1989 | Ausschnitt et al. ......... 364/491 |
| 5,108,570 A | 4/1992 | Wang ...................... 204/192.3 |
| 5,236,868 A | 8/1993 | Nulman ...................... 437/190 |
| 5,260,868 A | 11/1993 | Gupta et al. ................ 364/402 |
| 5,295,242 A | 3/1994 | Mashruwala et al. ....... 395/159 |
| 5,367,624 A | 11/1994 | Cooper ...................... 395/157 |
| 5,398,336 A | 3/1995 | Tantry et al. ............... 395/600 |
| 5,408,405 A | 4/1995 | Mozumder et al. ......... 364/151 |
| 5,410,473 A | 4/1995 | Kaneko et al. ......... 364/413.06 |
| 5,444,632 A * | 8/1995 | Kline et al. ................ 700/100 |
| 5,629,216 A | 5/1997 | Wijaranakula et al. ...... 438/502 |
| 5,698,989 A | 12/1997 | Nulman ...................... 324/719 |
| 5,715,181 A | 2/1998 | Horst ......................... 364/554 |
| 5,719,495 A | 2/1998 | Moslehi .................... 324/158.1 |
| 5,740,429 A | 4/1998 | Wang et al. ................ 395/615 |
| 5,754,297 A | 5/1998 | Nulman ...................... 356/381 |
| 5,787,000 A * | 7/1998 | Lilly et al. ................... 700/95 |
| 5,801,945 A * | 9/1998 | Comer ....................... 700/100 |
| 5,808,303 A | 9/1998 | Schlagheck et al. ........ 250/330 |
| 5,826,236 A * | 10/1998 | Narimatsu et al. ............. 705/8 |
| 5,883,437 A | 3/1999 | Maruyama et al. ......... 257/773 |
| 5,905,032 A | 5/1999 | Walton et al. ............ 435/173.2 |
| 5,910,011 A | 6/1999 | Cruse .......................... 438/16 |
| 6,054,379 A | 4/2000 | Yau et al. .................... 438/623 |
| 6,128,588 A | 10/2000 | Chacon ......................... 703/6 |
| 6,201,999 B1 * | 3/2001 | Jevtic ......................... 700/100 |
| 6,226,563 B1 * | 5/2001 | Lim .......................... 700/121 |

FOREIGN PATENT DOCUMENTS

| | | | |
|---|---|---|---|
| EP | 0877308 A | 11/1998 | ......... G05B/19/418 |
| JP | 11-67853 | 7/1989 | |
| JP | 1283934 | 11/1989 | |
| JP | 8-149583 | 6/1996 | ............ H04Q/9/00 |
| JP | 9-34535 | 2/1997 | ........... G05B/23/02 |

OTHER PUBLICATIONS

Prasad Rampalli et al., "CEPT–A Computer–Aided Manufacturing Application for Managing Equipment Reliability and Availability in the SemiConductor Industry", IEE Transactions on Components, Hybrids, and Manufacturing Technology, IEEE Inc. New York, vol. 14, No. 3, pp. 499–506, (1991).

(List continued on next page.)

Primary Examiner—Leo Picard
Assistant Examiner—Elliot L Frank
(74) Attorney, Agent, or Firm—Albert Dalhuisen

(57) ABSTRACT

The present invention provides a manufacturing environment (110) for a wafer fab, and an SPC environment (112) for setting control limits and acquiring metrology data of production runs. A computation environment (114) processes the SPC data, which are then analyzed in an analysis environment (116). An MES environment (118) evaluates the analysis and automatically executes a process intervention if the process is outside the control limits. Additionally, the present invention provides for an electrical power management system, a spare parts inventory and scheduling system and a wafer fab efficiency system. These systems employ algorithms (735, 1135 and 1335).

14 Claims, 17 Drawing Sheets

OTHER PUBLICATIONS

Semi E10–96, *Standard For Definition And Measurement Of Equipment Reliability, Availability And Maintainability (RAM)*, published by Semiconductor Equipment and Materials International (SEMI), pp. 1–23, 1996.

Semi Draft Doc. 2817, *New Standard: Provisional Specification for CIM Framework Domain Architecture*, published by Semiconductor Equipment and Materials International (SEMI), pp. 1–53, 1998.

W.R. Runyan et al. *Semiconductor Integrated Circuit Processing Technology*, Addison—Wesley Publ. Comp. Inc., p. 48, 1994.

Peter van Zandt, Microchip Fabrication, 3rd ed., McGraw–Hill, pp. 472–478, 1997.

R. Zorich, Handbook Of Quality Integrated Circuit Manufacturing, Academic Press Inc., pp. 464–498, 1991.

* cited by examiner

FIG.—1
(PRIOR ART)

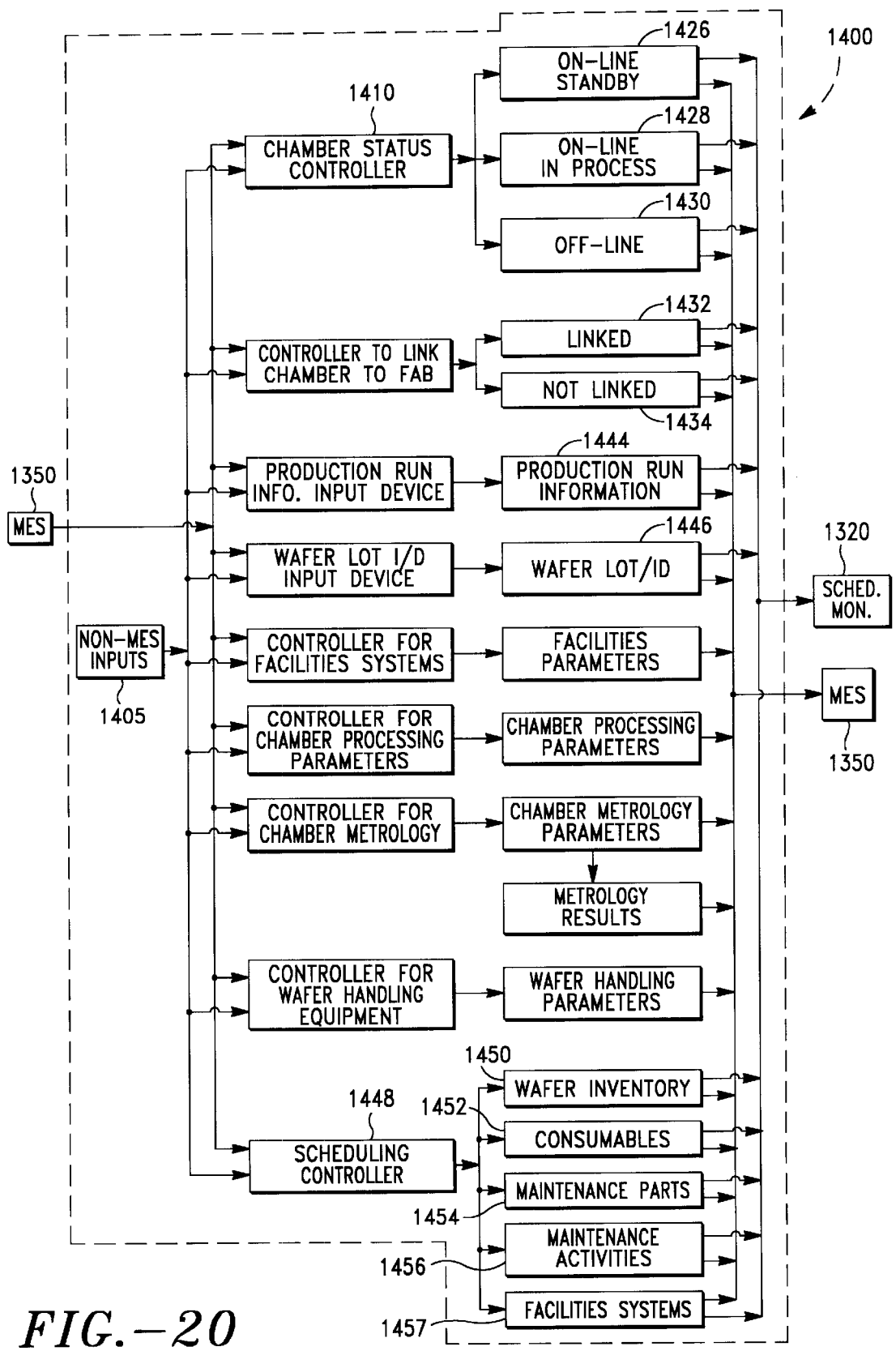
FIG.—20

SEMICONDUCTOR PROCESSING TECHNIQUES

REFERENCE TO RELATED APPLICATIONS

This application is related to the following applications having attorney docket No.: 003886/300MM/MBE, application Ser. No. 09/323,586, Jun. 1, 1999, attorney docket No.: 003887/300MM/MBE, application Ser. No. 09/323,751, Jun. 1, 1999 and attorney docket No. 003889/300MM/MBE, application Ser. No. 09/323,601, Jun. 1, 1999, Pat. No. 6,303,395 B1, wherein the present application and the cross-referenced applications have the same inventor and a common assignee.

FIELD OF THE INVENTION

The present invention relates to techniques for semiconductor wafer processing.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Integrated circuits are typically fabricated from semiconductor wafers in a process consisting of a sequence of processing steps. This process, usually referred to as wafer fabrication or wafer fab, includes such operations as oxidation, etch mask preparation, etching, material deposition, planarization and cleaning.

A summary of an aluminum gate PMOS (p-channel metal oxide semiconductor transistor) wafer fab process 40 is schematically shown in FIG. 1, illustrating major processing steps 41, 43, 45, 47, 49, 51, 53, 55, 57, 59, 61, 63, 65, 67, 69, 71 and 73, as described in W. R. Runyan et al., *Semiconductor Integrated Circuit Processing Technology*, Addison-Wesley Publ. Comp. Inc., p. 48, 1994. Each of these major processing steps typically include several sub steps. For example, a major processing step such as metallization to provide an aluminum layer by means of sputter deposition in a wafer fab chamber is disclosed in U.S. Pat. No. 5,108,570 (R. C. Wang, 1992). This sputter deposition process is schematically shown in sub steps 81, 83, 85, 87, 89, 91, 93, 95 and 97 of process 80, see FIG. 2.

FIGS. 1 and 2 show sequential wafer fab processes. It is also known to utilize wafer fab sub systems which provide parallel processing steps. Such sub systems typically include one or more cluster tools. A cluster tool as defined herein includes a system of chambers and wafer handling equipment wherein wafers are processed in the cluster tool chambers without leaving a controlled cluster tool environment such as vacuum. An example of a cluster tool is disclosed in U.S. Pat. No. 5,236,868 (J. Nulman, 1993) which employs a vacuum apparatus having a central chamber and four processing chambers. A wafer handling robot in the central chamber has access to the interior of each the processing chambers in order to transfer wafers from the central chamber into each of the chambers while keeping the wafers in a vacuum environment. In one example, wafers in the '868 cluster are first transferred for processing to a cleaning chamber, then to a PVD (physical vapor deposition) chamber, followed by transfer to an annealing chamber and subsequently to a degassing chamber, thus utilizing a sequential process. It is also known to use cluster tools such as those disclosed in the '868 patent to process wafers in chambers which are used in parallel. For example, if a slow processing step is followed by a fast processing step, three chambers can be used in parallel for the slow process while the fourth chamber is used for the fast process.

It is well known to those of ordinary skill in the art that one or more processing parameters of a typical wafer fab process step need to be controlled within a relatively narrow range in order to obtain a product which has the desired characteristics. For example, U.S. Pat. No. 5,754,297 (J. Nulman, 1998) discloses a method and apparatus for monitoring a deposition rate during wafer fab metal film deposition such as sputtering. The '297 patent teaches that the metal deposition rate decreases with increasing age of the sputter target if the input sputter power level is maintained at a constant level. As a consequence, critical processing characteristics, such as the metal deposition rate, may vary from run to run for a given wafer fab processing chamber in ways that can affect the yield and quality of devices processed in that chamber. As disclosed in the '297 patent, the deposition system can be more readily maintained near desired levels when processing variables, such as the power input to the sputtering source, are adjusted in response to observed variations in the metal deposition processing characteristics. This requires in-situ measurement of processing characteristics, using for example a deposition rate monitor based on the optical attenuation of light passing through the deposition environment, thereby detecting the rate at which material is flowing from the deposition source to the deposition substrate, as described more fully in the '297 patent.

Advances in semiconductor materials, processing and test techniques have resulted in reducing the overall size of the IC circuit elements, while increasing their number on a single body. This requires a high degree of product and process control for each processing step and for combinations or sequences of processing steps. It is thus necessary to control impurities and particulate contamination in the processing materials such as process gases. Also, it is necessary to control processing parameters such as temperature, pressure, gas flow rates, processing time intervals and input sputter power, as illustrated in the '570 and '297 patents. As illustrated in FIGS. 1 and 2, a wafer fab includes a complex sequence of processing steps wherein the result of any particular processing step typically is highly dependent on one or more preceding processing steps. For example, if there is an error in the overlay or alignment of etch masks for interconnects in adjacent IC layers, the resulting interconnects are not in their proper design location. This can result in interconnects which are packed too closely, forming electrical short defects between these interconnects. It is also well known that two different processing problems can have a cumulative effect. For example, a misalignment of interconnect etch masks which is not extensive enough to result in an electrical short, can still contribute to causing an electrical short if the process is slightly out of specification for allowing (or not detecting) particulate contamination having a particle size which would not have caused an electrical short if the interconnect masks had been in good alignment.

Processing and/or materials defects such as described above generally cause a reduced wafer fab yield, wherein the yield is defined as the percentage of acceptable wafers that are produced in a particular fab. In-process tests and monitoring of processing parameters are utilized to determine whether a given in-process product or process problem or defect indicates that intervention in the process run is necessary, such as making a processing adjustment or aborting the run. Consequently, product and process control techniques are used extensively throughout a wafer fab. When possible, yield problems are traced back to specific product or processing problems or defects to ultimately improve the yield of the wafer fab. High yields are desirable for minimizing manufacturing costs for each processed wafer and to maximize the utilization of resources such as electrical power, chemicals and water, while minimizing scrap re-work or disposal.

It is known to use SPC (statistical process control) and SQC (statistical quality control) methods to determine suitable wafer fab control limits and to maintain the process within these limits, see for example R. Zorich, *Handbook Of Quality Integrated Circuit Manufacturing*, Academic Press Inc., pp. 464–498, 1991. SPC and SQC methodologies suitable for a wafer fab include the use of control charts, see for example R. Zorich at pp. 475–498. As is well known to those of ordinary skill in the art, a control chart is a graphical display of one or more selected process or product variables, such as chamber pressure, which are sampled over time. The target value of a particular variable and its upper and lower control limits are designated on the chart, using well known statistical sampling and computation methods. The process is deemed out of control when the observed value of the variable, or a statistically derived value such as the average of several observed values, is outside the previously determined control limits. Control limits are typically set at a multiple of the standard deviation of the mean of the target value, such as for example $2\sigma$ or $3\sigma$. The target value is derived from a test run or a production run which meets such wafer fab design criteria as yield, process control and product quality. SPC and SQC are considered synonymous when used in the above context, see R. Zorich at p. 464.

Effective wafer inventory management is necessary for maintaining inventories of unprocessed or partly processed wafers at a minimum and thereby minimizing the unit cost of the semiconductor devices which are produced in the wafer fab. Minimizing inventories of wafers in process also has a wafer yield benefit because it is well known that the longer wafers are in the process, the lower their yield. Wafer inventory management typically uses scheduling techniques to maximize equipment capabilities in view of the demand for processed wafers, for example by scheduling parallel and series processing steps to avoid processing bottlenecks. Effective inventory control of a wafer fab also requires a low incidence of bottlenecks or interruptions due to unscheduled down times which can for example be caused by unscheduled maintenance, interruptions resulting from processing parameters which are outside their specified limits, unavailability of required materials such as a process gas, unavailability of necessary maintenance replacement parts, unavailability of a processing tool such as a chamber, or electrical power interruptions.

Many components or sub-systems of a wafer fab are automated in order to achieve a high degree of processing reliability and reproducibility and to maximize yields. Wafer fab tools such as chambers are typically controlled by a computer using a set of instructions which are generally known as a recipe for operating the process which is executed by the tool. However, it is recognized that a high degree of automation wherein various processes and metrologies are integrated, is difficult to achieve due to the complexity and inter dependency of many of the wafer fab processes, see for example Peter van Zandt, *Microchip Fabrication*, 3$^{rd}$ ed., McGraw-Hill, pp. 472–478, 1997.

Wafer fabs require effective maintenance scheduling in order to maintain reliability of all components in the wafer fab. This generally results in having a costly spare parts inventory, thus adding to the IC production cost.

Electrical circuit breaker ratings for wafer fabs are generally much higher than the average power usage rate due to the need to absorb power surges in wafer fab equipment during processing. The high circuit breaker ratings require costly equipment in order to accommodate the power surges and peak power demands.

Accordingly, a need exists for methods and techniques which provide improved process control, quality, yield and cost reduction.

SUMMARY OF THE INVENTION

The present invention provides novel techniques for semiconductor processing, particularly for wafer manufacturing, which provide the needed improvements in process control, quality, yield and cost reduction.

In one embodiment of the present invention, an SPC technique is integrated with a wafer manufacturing process. Control limits for the manufacturing process are determined using processing parameters which are indicative of a manufacturing process meeting the processing and yield requirements of the process. SPC is then employed to determine whether subsequent production runs are executed within the control limits, testing the same parameters as were used to determine the control limits for the process. Automatic process intervention is initiated by the integrated SPC techniques to, for example, correct the process or abort it if the process is outside the control limits.

In another embodiment of the present invention, a manufacturing environment is provided for processing a wafer in a wafer fab chamber. An SPC environment is integrated with the manufacturing environment, to establish the process control limits and to acquire process and/or product metrology information from production runs in the manufacturing environment using the same parameters as were used to establish the control limits. A computation environment is used to process the data and information contained in the SPC environment. The SPC data are analyzed in an analysis environment by comparing the control limits with the process data. An MES (manufacturing execution system) environment acquires the analysis and determines whether the process of the manufacturing environment is executed within or outside the control limits. The MES environment automatically intervenes with the manufacturing environment for corrective action if the process is executed outside the control limits.

Additional embodiments provide for processing techniques for wafer fab sub-systems, and for one or more wafer fabs employing SPC techniques which are integrated with the manufacturing processes.

In another embodiment of the present invention, a manufacturing environment is provided for processing wafers in a wafer fab chamber. A novel electrical power management system is integrated with the manufacturing environment of a wafer fab for scheduling and regulating electrical power such that high power demand peaks are avoided. This system includes a power monitor environment for collecting information from a manufacturing environment such as a processing chamber, a computation environment for processing data and information and an analysis environment to assist in analyzing the results obtained in the computation environment. The electrical power management system collects processing tool information relating to electrical power usage and tool scheduling and then uses this information in a novel algorithm to schedule the usage of processing tools such that anticipated power surges are scheduled to occur during relatively low power usage periods of the wafer fab. This avoids power peaks during wafer fab processing, thus lowering the wafer fab electrical circuit breaker ratings and thereby lowering the wafer fab cost.

In still another embodiment of the present invention, a wafer fab is provided with a novel spare parts inventory and scheduling system. This system utilizes an algorithm to automatically order spare parts for delivery on a date just prior to the date on which the part is needed.

In yet another embodiment of the present invention, a wafer fab is provided with a novel wafer fab efficiency system employing an algorithm for more efficient scheduling of wafer fab resources, resulting in a more efficient wafer flow and thus maximizing die output and wafer fab utilization.

BRIEF DESCRIPTION OF THE DRAWINGS

FIG. 20 is a block diagram schematically showing a processing chamber of the wafer fab illustrated in FIG. 19.

DETAILED DESCRIPTION OF THE INVENTION

While describing the invention and its embodiments, certain terminology will be utilized for the sake of clarity. It is intended that such terminology includes the recited embodiments as well as all equivalents.

Figure 1:
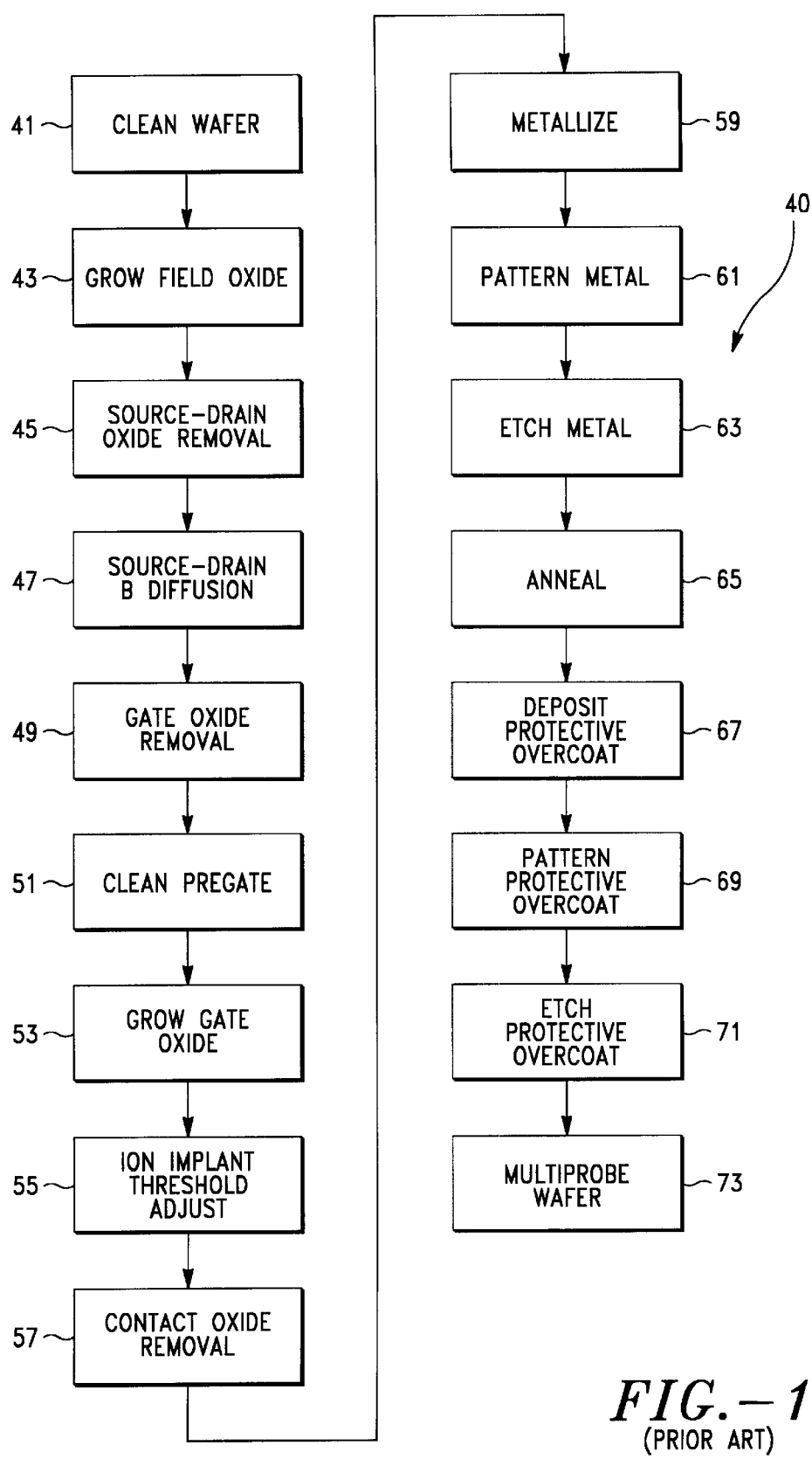
FIG. 1 is a flowchart schematically illustrating a prior art wafer fab process.
Figure 2:
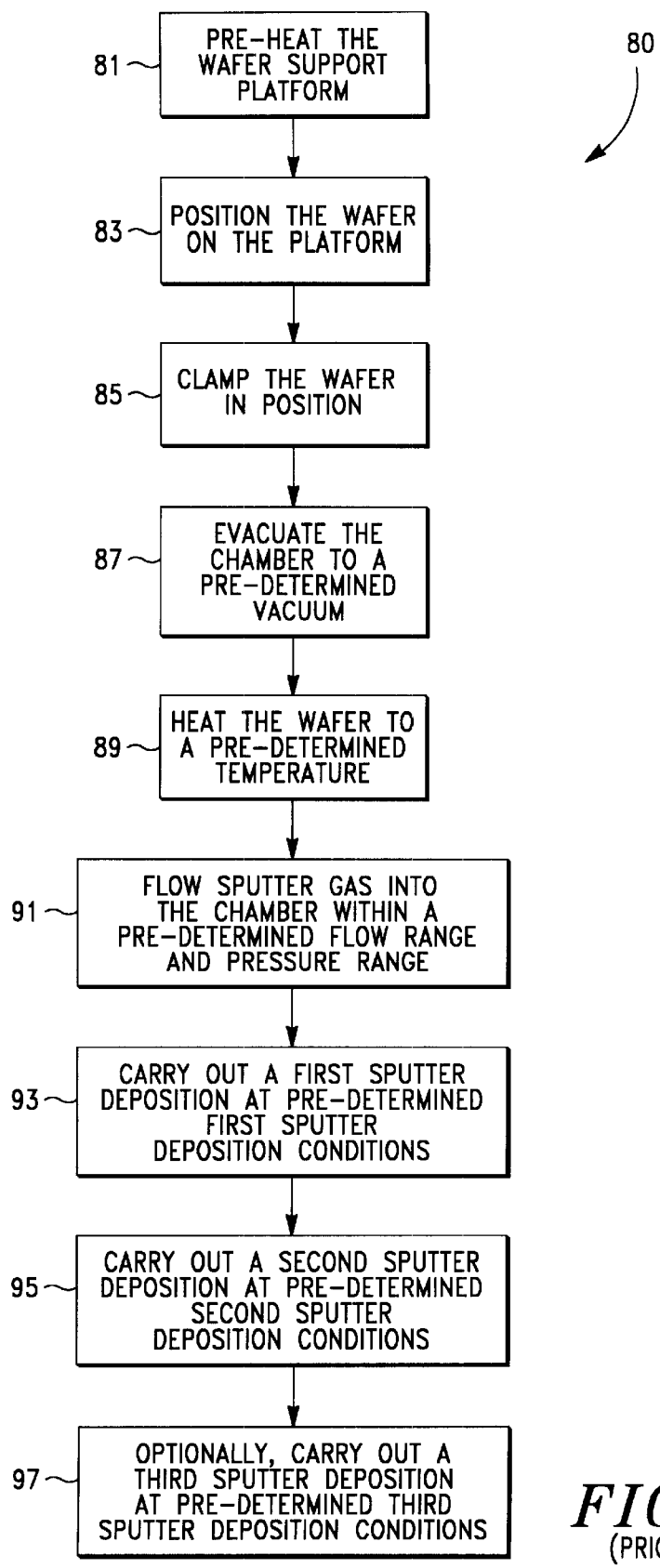
FIG. 2 is a flowchart schematically illustrating a prior art wafer fab sputter metallization process.
Figure 3:
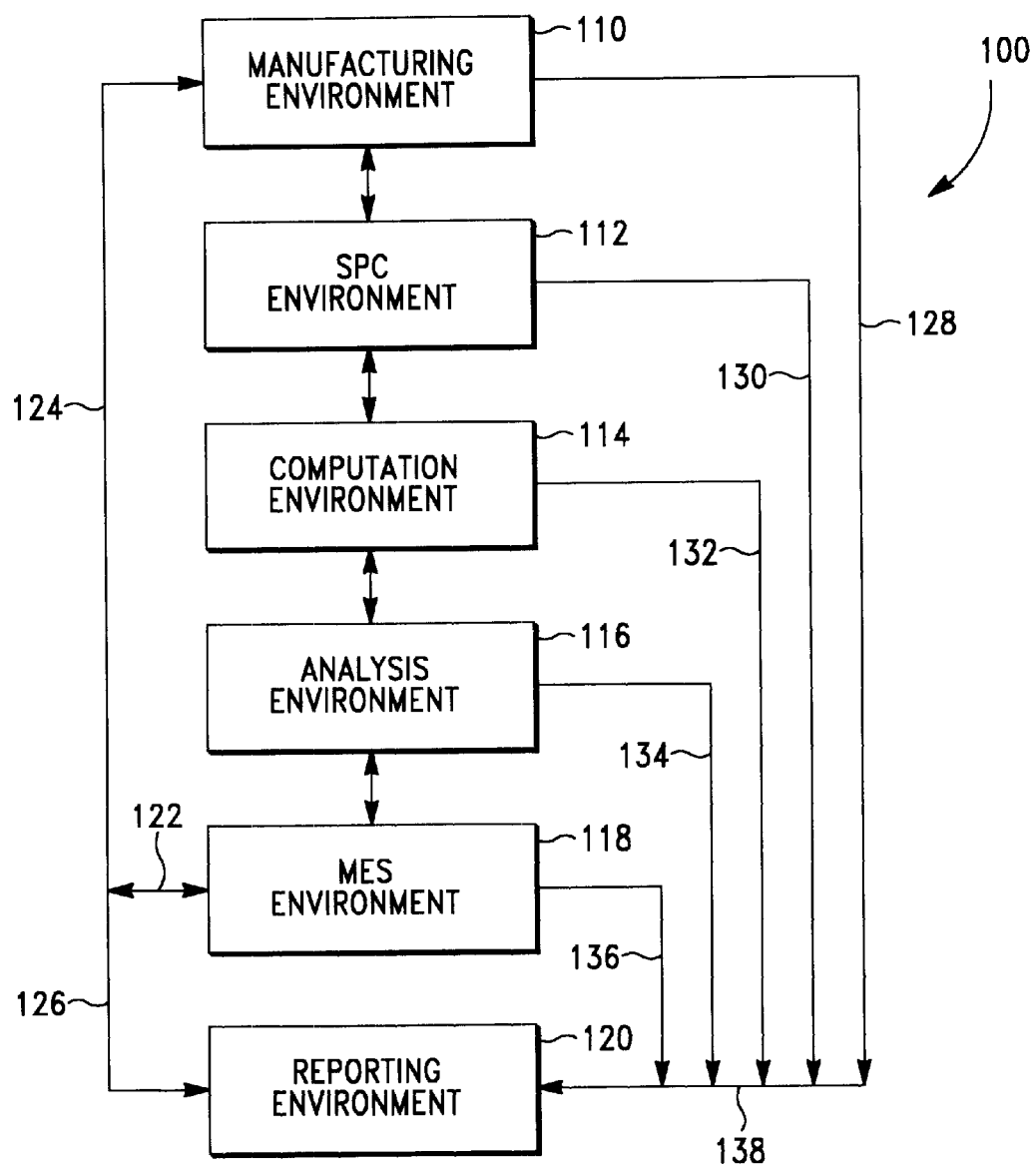
FIG. 3 is a block diagram schematically illustrating an SPC integrated wafer fab of the present invention.

One embodiment of the invention, schematically illustrated in FIG. 3, shows an SPCIF (SPC integrated fab) 100. As defined herein, an SPCIF includes a wafer fab, a wafer fab sub-system or combination of two or more wafer fabs wherein SPC is integrated with one or more wafer fab process control techniques and optionally to other wafer fab systems, sub-systems or components. SPCIF 100, shown in FIG. 3, includes a manufacturing environment 110, an SPC environment 112, a computation environment 114, an analysis environment 116, an MES environment 118 and a reporting environment 120. The expression "environment" as defined herein, includes an aggregate of technologies, methods and/or devices which provide a resource for acquiring data, data structures or information and which, optionally, can interact with the acquired data, data structures or information. An environment as used herein, includes a computer environment. The expression "computer environment" as defined herein, includes computer software and/or hardware which provides a resource for acquiring data, data structures or information and which can interact with the acquired data, data structures or information.

Manufacturing environment 110, shown in FIG. 3, includes manufacturing apparatus, techniques and methods to manufacture wafer fab devices or device components such as IC structures. The expression "IC structures" as defined herein, includes completely formed ICs and partially formed ICs. The manufacturing environment includes such controllers and inputs as are necessary to form the IC structure. Suitable controllers include processors for example micro processors such as on-board computers, computer operated software and mechanical/electrical controllers such as switches and electrical circuits employing for example a variable resistor such as a potentiometer. These controllers operate or control various processes and operational functions, such as gas flow rate and wafer handling within manufacturing environment 110. Suitable examples of manufacturing environments such as 110 include a wafer fab tool, such as a chamber, or one or more wafer fabs.

SPC environment 112, see FIG. 3, utilizes SPC methodologies such as are well known to those of ordinary skill in the art, to determine process control limits meeting the design and yield criteria for producing a particular IC structure. The control limits are statistically derived using one or more processing and/or in-process product parameters which are indicative of a process meeting the design and yield criteria for manufacturing the IC structure. Once the control limits are established, the SPC environment acquires process and/or product methodology information from production runs for producing these IC structures, using the same parameters as were used to establish the control limits. Computation environment 114, for example including a data processor, is employed to perform the calculations to support the data processing of SPC environment 112. Analysis environment 116, shown in FIG. 3, is provided to analyze SPC data provided in SPC environment 112 by comparing the metrology data with the control limits. Alternately, analysis environment 116 can be incorporated in SPC environment 112 or in computation environment 114.

MES (manufacturing execution system) environment 118, shown in FIG. 3, provides the information, control, decision making and coordinating functions of the production related activities of SPCIF 100. MES environment 118 acquires the results of the SPC analysis as determined in analysis environment 116. The MES environment then determines whether the process of manufacturing environment 110 is within or outside the SPC control limits. A decision making function in MES environment 118 can then be invoked to decide whether or not to initiate intervention in manufacturing environment 110. Such intervention can include aborting the run, adjusting parameters such as chamber pressure, scheduling additional wafers for processing or scheduling maintenance activities. This intervention can be executed through links 122 and 124 of SPCIF 100, as shown in FIG. 3. Optionally, SPCIF 100 is provided with a reporting environment 120 to acquire data and other information from the environments of the present invention, for example using links 128, 130, 132, 134 136 and 138 depicted in FIG. 3. Also, when MES environment 118 is linked to manufacturing environment 110, a report can simultaneously be generated using link 126 to reporting environment 120.

SPCIF 100 schematically illustrated in FIG. 3 provides SPC which is integrated with manufacturing. This integration results in real time monitoring of process control and/or product quality and provides real time process intervention as soon as certain preselected process or product parameters are outside the control limits. It also facilitates more effective scheduling of tool availability, materials inventory and real time knowledge as well as scheduling capability for facilities such as electrical power requirements in the manufacturing process.

Figure 4:
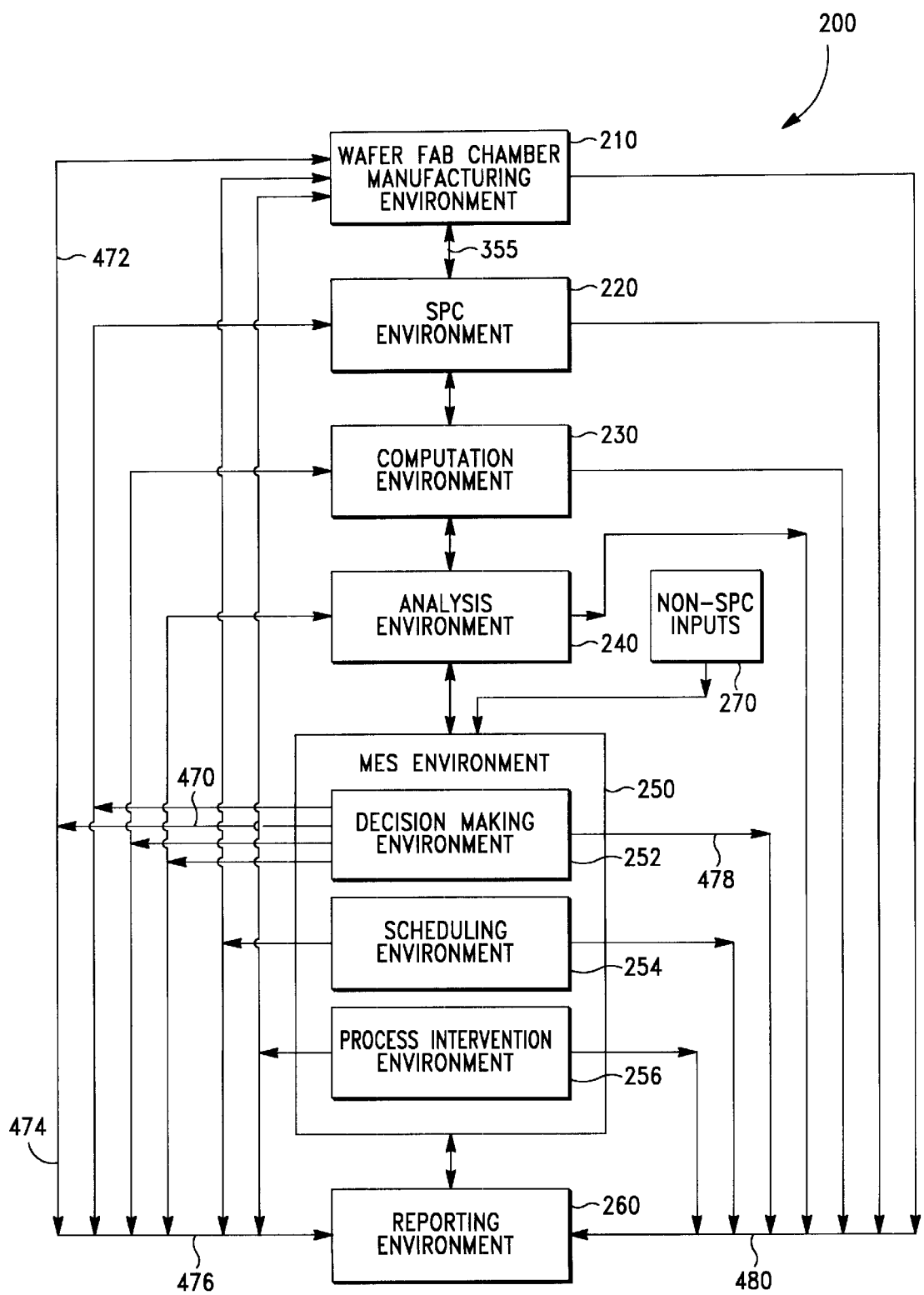
FIG. 4 is a block diagram schematically illustrating another embodiment of an SPC integrated wafer fab of the present invention.

FIG. 4 is a schematic illustration of another embodiment of the present invention showing SPCIF 200 wherein SPC is integrated with wafer processing in one chamber of a wafer fab. SPCIF 200 includes a wafer fab chamber manufacturing environment 210, an SPC environment 220, a computation environment 230, an analysis environment 240, an MES environment 250 and a reporting environment 260. MES environment 250 includes a decision making environment 252, a scheduling environment 254 and a process intervention environment 256. Optionally, the MES environment can also include an MIS (management information system) component (not shown).

Figure 5:
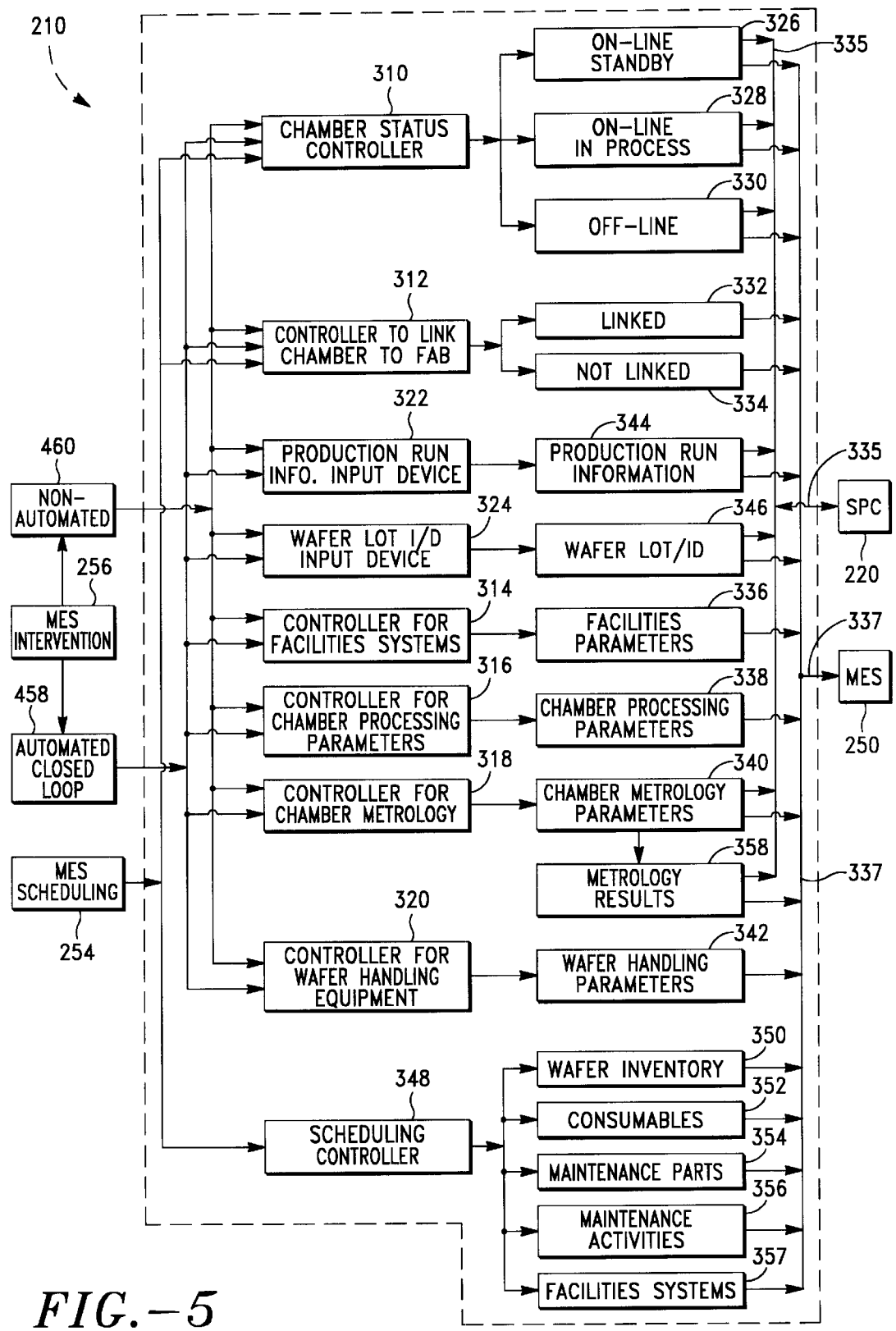
FIG. 5 is a block diagram schematically showing a wafer fab manufacturing environment of the SPC integrated wafer fab illustrated in FIG. 4.

As shown in FIGS. 4 and 5, wafer fab chamber manufacturing environment 210 of SPCIF 200 receives various inputs from MES environment 250 and from SPC environment 220. MES process intervention environment 256 provides for automated or closed loop intervention 458 (FIG. 5) and optionally for non-automated intervention 460, as will be described in more detail in connection with FIG. 7. Returning to FIG. 5, the intervention includes setting or regulating chamber controllers such as controllers 310, 312, 314, 316, 318 and 320, and providing information to input devices 322 and 324. Based on MES input, chamber status controller 310 is employed to select the status of the chamber: on-line in standby 326, on-line in-process 328 or off-line 330. Controller 312 is utilized to select the chamber status as linked 332 or not linked 334 to the wafer fab system (not shown). Controller 314 controls parameters 336 of the facilities systems, such as electrical power, water and waste product removal. Controller 316 controls chamber processing parameters 338, such as process gas flow rate and pressure. Chamber metrology parameters 340 are controlled by controller 318, these include controlling in-process test parameters such as for example the '297 sputter deposition rate monitor, and test sampling frequency. Wafer handling parameters 342, such as the operational parameters of a wafer handling robot, are controlled by controller 320. Input from MES process intervention environment 256 can be utilized to abort a production run using chamber status controller 310 to put the chamber in an off-line status and thereby stop all processing functions of the chamber.

MES process intervention environment 256, see FIG. 5, can be utilized to provide production run information 344 by means of production run information input device 322. Such information can include run identification, date or purpose of the run, e.g. testing, production or re-work. Wafer and wafer lot identification 346 in wafer fab chamber manufacturing environment 210 can be provided by means of wafer identification input device 324.

MES scheduling environment 254, shown in FIG. 4, provides additional MES inputs to wafer fab chamber manufacturing environment 210, as is depicted in more detail in FIG. 5. The scheduling environment is an additional input to chamber status controller 310. Also, this environment is an additional input to controller 312 to optionally link the chamber to a wafer fab. Scheduling controller 348, FIG. 5, of chamber manufacturing environment 210 receives inputs from MES scheduling environment 254 to control wafer inventory 350, consumables 352, maintenance parts 354, maintenance activities 356 and facilities systems scheduling 357 for example scheduling the electrical power needed for executing the manufacturing process within the chamber. MES scheduling environment 254 coordinates scheduling of various functions or activities. For example, maintenance activities scheduling 356 is coordinated with chamber status controller 310, such as scheduling the status of the chamber off-line 330 for maintenance activities 356 or scheduling wafer inventory 350 and consumables 352 such as process gas in coordination with an on-line in-process status 328.

Chamber metrology results 358 are obtained from the use of test procedures employing chamber metrology parameters 340. These results include for example the rate at which material is flowing from a sputter deposition source to a deposition substrate, as disclosed in the '297 patent.

SPCIF 200 utilized an SPC environment 220, as illustrated in FIG. 4, to establish process control limits for the process in chamber manufacturing environment 210 and to acquire in-process metrology results from manufacturing environment 210. SPC data acquisition from chamber manufacturing environment 210 is schematically illustrated in FIG. 5 as follows. Chamber status information is provided to SPC environment 220 by on-line standby 326, on-line in process 328 and off-line 330. Production run information 344 and wafer ID 346 data as well as chamber metrology parameter information 340 and metrology results 358 can be provided to SPC environment 220 through a link 355, see FIG. 4.

SPCIF 200 utilized an SPC environment 220, as illustrated in FIG. 4, to establish process control limits for the process in chamber manufacturing environment 210 and to acquire in-process metrology results from manufacturing environment 210. SPC data acquisition from chamber manufacturing environment 210 is schematically illustrated in FIG. 5 as follows. Chamber status information is provided to SPC environment 220 by on-line standby 326, on-line in process 328 and off-line 330. Production run information 344 and wafer ID 346 data as well as chamber metrology parameter information 340 and metrology results 358 can be provided to SPC environment 220 through a link 355, see FIG. 4.

SPC methodologies suitable for the present invention include control chart methodologies and Pareto charts. A Pareto chart is a bar chart representation which displays a ranking of the number of occurrences of a particular defect as compared with the cumulative number of occurrences of all defects and the number of occurrences of each of the other defects or problems. Control charts are particularly suitable for techniques of the present invention. As is well known to those of ordinary skill in the art, control limits are typically determined following the collection of a statistically significant number of data, which are relevant to an important or critical parameter indicative of the process operating as designed and resulting in an acceptable yield. A suitable parameter for a process carried out in chamber manufacturing environment 210 can include sputter power in a sputter deposition process, gas flow rate and/or pressure, and particle contamination in the chamber environment. Metrology data measuring these parameters at specific intervals provide the input for the determination of control limits. Additionally, metrology data concerning in-situ product testing can be used in a similar way. For example using the technology disclosed in U.S. Pat. No. 5,698,989 (J. Nulman, 1997) for measuring the sheet resistance of an electrically conductive film on a semiconductor substrate in-situ, while maintaining the substrate within the vacuum environment of the semiconductor process apparatus. The data which are obtained for the process while running in control, i.e. within operational specification and yield, are then computed to determine the process control limits using statistical methods such as those which are well known to those of ordinary skill in the art. Subsequent production runs are then analyzed using metrology data of the same processing or in-situ product parameters as were used to determine the control limits.

SPC environment 220, schematically shown in FIGS. 4 and 5, contains the control limits and acquires the metrology information from chamber manufacturing environment 210. The SPC environment includes a component for reporting and/or displaying the control limits and the processing or in-situ product metrology data of a production run. The reporting and/or displaying component resides in reporting environment 260, see FIG. 4, and includes graphical and/or numerical display on a monitor or on a print-out.

Figure 6:
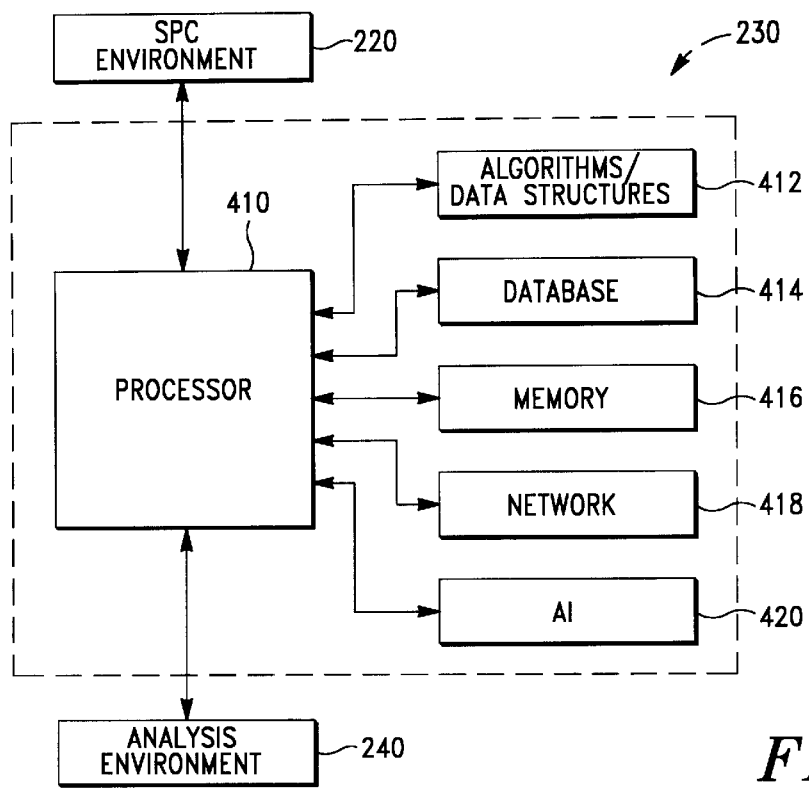
FIG. 6 is a block diagram schematically showing a computation environment of the SPC integrated wafer fab illustrated in FIG. 4.

Computation environment 230, depicted in FIGS. 4 and 6, is utilized to perform the calculations to support the data processing and reporting of the SPC environment. Computation environment 230 typically includes a processor such as a microprocessor 410 (FIG. 6), algorithms or data structures 412, a database 414, a memory 416, optionally a network component 418 and optionally an AI (artificial intelligence) component 420.

Algorithms or data structures 412 (FIG. 6) are employed using methods which are well known to those of ordinary skill in the art to operate processor 410 and any peripheral devices associated with this processor, as well as for processing the metrology and statistical data which are utilized in SPC environment 220. Database 414 contains necessary parameter, metrology and statistical data. Memory 416 can for example be used to store in-process metrology data. Optional network component 418 provides a link between SPCIF 200 and external entities such as a remote database or a remote management function using for example a bus or a LAN (local area network). AI component 420 can for example be used to process the statistical data stored in database 414 to derive control limits or select metrology data, based on experience gained over many production runs, to derive more effective process control.

Computation environment 230, as described herein, is utilized in conjunction with SPC methodologies and procedures of the present invention. However, it is also contemplated to use this computation environment for any and all functions of processes carried out in connection with wafer fab manufacturing environment 210.

As schematically shown in FIGS. 4 and 6, an analysis environment 240 is provided to analyze SPC data in SPC environment 220 by comparing the metrology data of the process in a particular product run with the pertinent control limits. This analysis can be performed by a processor using methods which are well known to those of ordinary skill in the art, for example using computation environment 230. The analysis can also be performed by observation of a graphical representation wherein the metrology data, or statistically derived values of these data, are plotted on a graph which shows the control limits. Also, a numerical comparison between metrology data and control limit data can be a suitable basis for performing the analysis. While analysis environment 240 has been shown as an environment which is separate from the other environments of this invention, it is also contemplated to integrate analysis environment 240 with computation environment 230 (FIG. 4) or with SPC environment 220.

Figure 7:
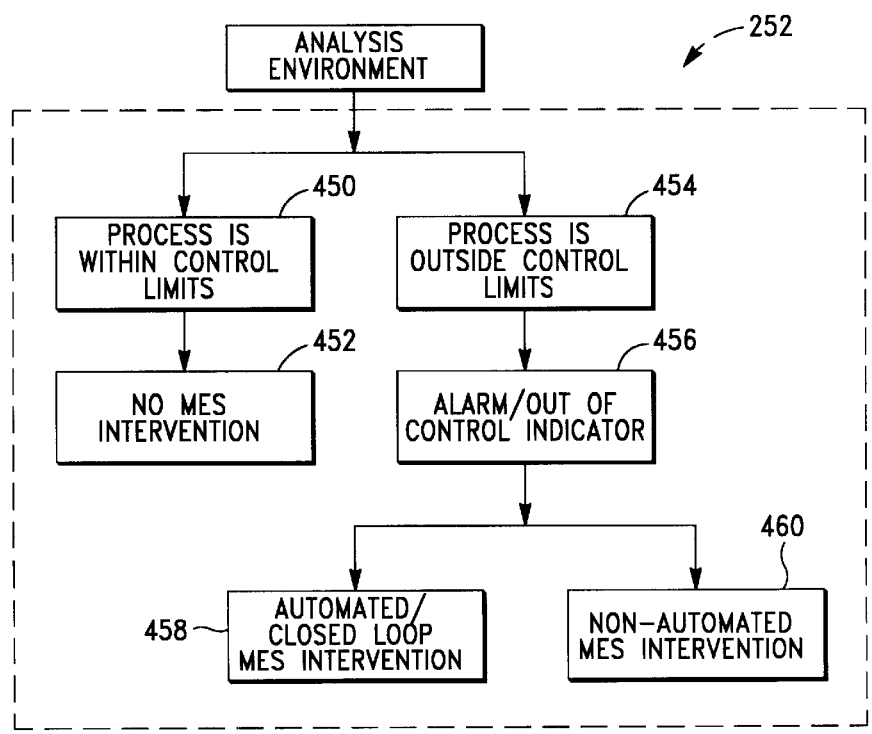
FIG. 7 is a block diagram schematically showing a decision making environment of the SPC integrated wafer fab illustrated in FIG. 4.

The results of the analysis performed in analysis environment 240 are acquired by decision making environment 252 of MES environment 250, as is schematically illustrated in FIG. 7. When decision making environment 252 determines that the process is operating within the predetermined control limits, see process status 450 of FIG. 7, there is no MES intervention 452. However, when analysis shows that the process is outside the control limits, (status 454) an alarm or out of control indicator 456 is preferably activated and an MES decision is made to intervene in the process. This intervention can be an automated/closed loop intervention 458 or a non-automated MES intervention 460. MES decision making environment 252 can for example be configured to have an automated intervention response when a specific processing parameter is outside its control limits. Such an automated intervention can include automatically aborting the production run. A non-automated intervention can be a pre-set condition of decision making environment 252, or it can be the result of a specific out of control limits condition.

FIG. 5 schematically illustrates automated MES intervention 458 and non-automated MES intervention 460 interaction with chamber manufacturing environment 210 by affecting controllers 310, 312, 314, 316, 318 and 320, as well as information input devices 322 and 324 as previously described in connection with manufacturing environment 210. These interactions between decision making environment 252 and manufacturing environment 210 comprise process intervention environment 256 depicted schematically in FIG. 4. MES scheduling environment 254, schematically shown in FIGS. 4 and 5, utilizes data and information from MES decision making environment 252 (FIG.

4) and MES process intervention environment 256 to interact with chamber manufacturing environment 210 by affecting controllers 310, 312 and 348 to control the functions which have been described in connection with chamber manufacturing environment 210. Typically, wafer fab chamber manufacturing environment 210 employs an on-board computer or distributed computer function in order to operate or control various processes and operational functions and it will be understood that MES environment 250 may require special protocols in order to access chamber manufacturing environment 210.

As depicted in FIG. 5, link 335 provides a link between SPC environment 220 and manufacturing environment 210 links to on-line standby 326, online in process 328, off-line 330, production run information 344, wafer lot/ID 346, chamber metrology parameters 340 and metrology results 358. Continuing to refer to FIG. 5, link 337 provides a link between MES environment 250 and manufacturing Reporting environment 260 can acquire data and other information from the various environments of the present invention as is schematically illustrated in FIG. 4. For example, when MES decision making environment 252 is linked to chamber manufacturing environment 210 through links 470 and 472, a report can simultaneously be generated in reporting environment 260 through links 470, 474 and 476. It is also contemplated to generate reports concerning decision making environment 252 which are not related to any specific interaction between this environment and the chamber manufacturing environment, using for example links 478 and 480 shown in FIG. 4. Reports generated by reporting environment 260 include printed matter, display on a computer monitor and voice. These reports can be generated in real time. It is also contemplated to provide reports generated by this environment to a network such as network 418 shown in FIG. 6.

The foregoing description of SPCIF 200 concerns interactions of SPC related methodologies and techniques as these are utilized in connection with wafer processing in a wafer fab chamber. However, non-SPC inputs 270 (FIG. 4) can also be provided to the MES environment. These inputs can for example include security related inputs or commands to override SPC as may be necessary for processing a test run in the chamber.

Figure 8:
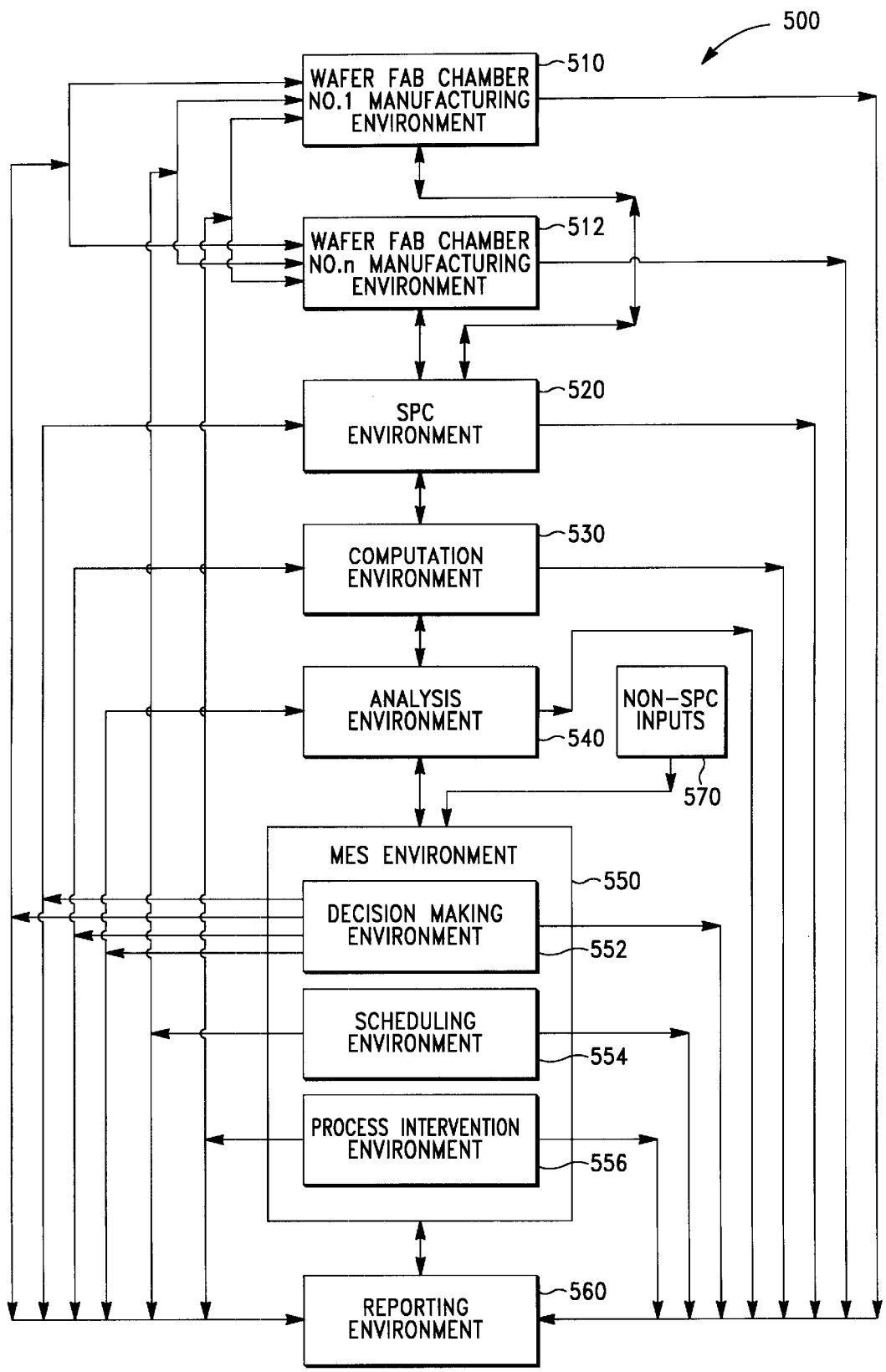
FIG. 8 is a block diagram schematically illustrating an alternate embodiment of a SPC integrated wafer fab of the present invention.

FIG. 8, showing SPCIF 500, schematically illustrates a SPCIF having a plurality of wafer fab processing tools such as n chambers. The n chambers of this additional embodiment of the present invention, can include a wafer sub system such as the chambers in a cluster tool or all processing tools within a wafer fab such that SPCIF 500 represents a SPCIF for a complete wafer fab. The n chambers of SPCIF 500 are represented by wafer fab chamber No. 1 manufacturing environment 510 and wafer fab chamber No. n manufacturing environment 512. Each of these manufacturing environments is similar to wafer chamber manufacturing environment 210 which has been described above in connection with SPCIF 200. It will be understood that chamber No. 1 manufacturing environment 510 and chamber No. n manufacturing environment 512 are linked to each other or to the same wafer fab, for example using controllers similar to controller 310 (FIG. 5) of wafer fab manufacturing environment 210. The non-manufacturing environments of SPCIF 500 are similar to those of the corresponding environments of SPCIF 200 except that the non-manufacturing environments of SPCIF 500 are responsive to each of the n chamber manufacturing environments of SPCIF 500. For example, SPC environment 520 (FIG. 8) of SPCIF 500 has control limit data for each of the n chambers or tools and is adapted to receive the relevant metrology data from each of these chambers. The non-manufacturing environments of SPCIF 500, shown in FIG. 8, include SPC environment 520, computation environment 530, analysis environment 540, reporting environment 560 and MES environment 550 having decision making environment 552, scheduling environment 554 and process intervention environment 556. Additionally, SPCIF 500 is preferably adapted to accept non-SPC inputs 570.

Figure 9:
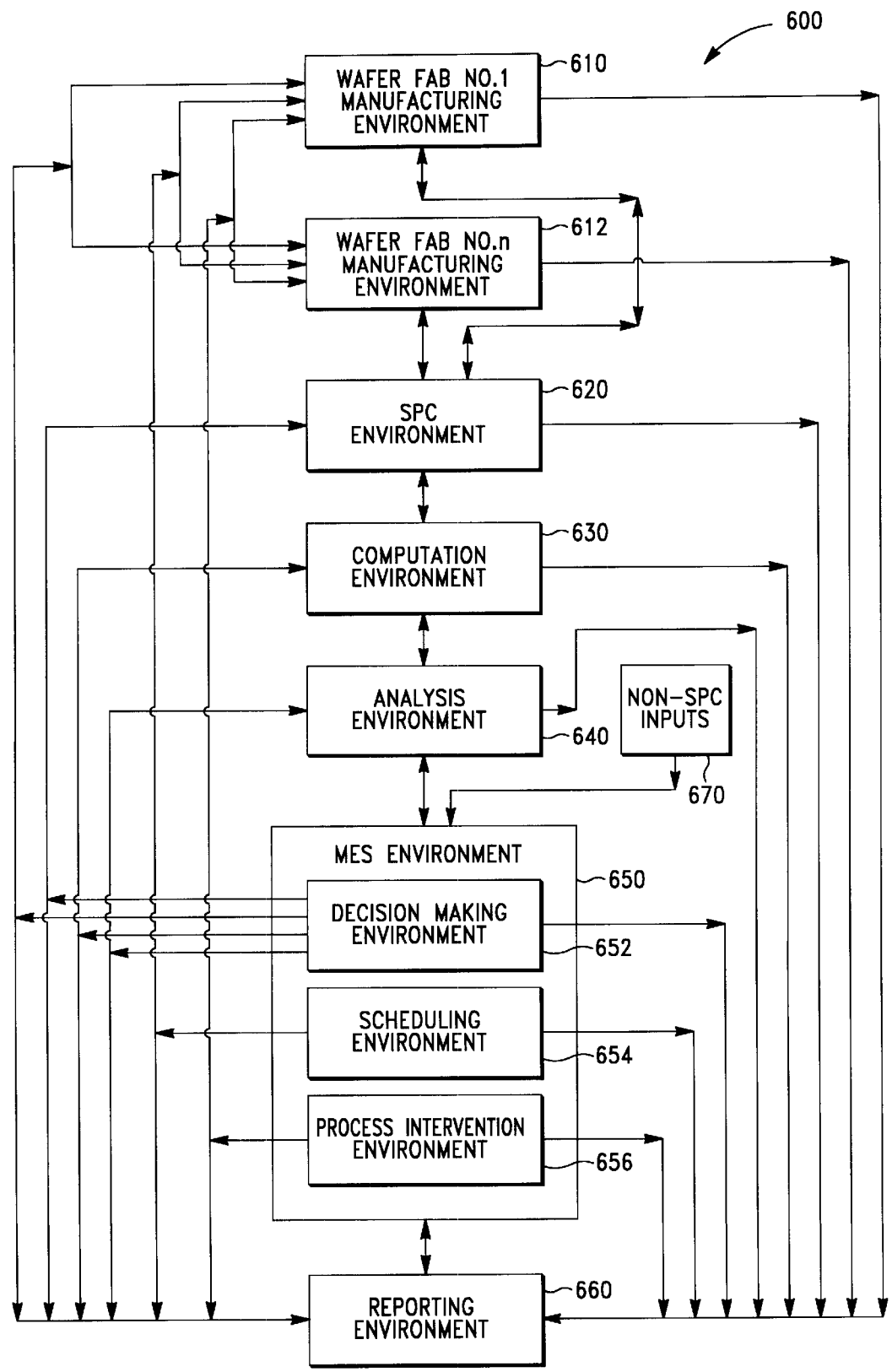
FIG. 9 is a block diagram schematically illustrating another embodiment of an PC integrated wafer fab of the present invention.

Another embodiment of the present invention is shown in FIG. 9, schematically illustrating SPCIF 600. This SPCIF depicts wafer fab No. 1 manufacturing environment 610 and wafer fab No. n manufacturing environment 612, representing n wafer fabs. One or more of the n wafer fabs can be at a remote location because the present invention is operable when the n wafer fabs are linked electronically for example employing network connections using such methods and techniques as are known to those of ordinary skill in the art. Also, the present invention is operable when the computation environment is a distributed computation environment such as distributed databases and distributed processor facilities. Each of the wafer fab manufacturing environments of SPCIF 600 is similar to the n chamber manufacturing environment of SPCIF 500. The non-manufacturing environments of SPCIF 600 are similar to those of the corresponding environments of SPCIF 500, except that the non-manufacturing environments of SPCIF 600 are responsive to each of the n wafer fab manufacturing environments of SPCIF 600. For example, SPC environment 620 (FIG. 9) has control limit data for each of the n wafer fabs and is adapted to receive the relevant metrology data from each of these wafer fabs. The non-manufacturing environments of SPCIF 600, depicted in FIG. 9, include SPC environment 620, computation environment 630, analysis environment 640, reporting environment 660 and MES environment 650 having decision making environment 652, scheduling environment 654 and process intervention environment 656. Additionally, SPCIF 600 is preferably adapted to accept non-SPC inputs 670. SPCIFs 100, 200, 500 and 700, illustrated in FIGS. 3, 4, 8 and 9 respectively, provide SPC methodology which is integrated with a manufacturing environment thereby resulting in real time responses to out of control excursions of the process, where these excursions are representative of processing defects. Real time responses minimize the production of out of specification products thus leading to a more effective use of materials and facilities and providing an early indication when a processing tool, or entire wafer fab, needs to be taken off-line for adjustments or maintenance. Real time knowledge of the quality status of various manufacturing components also enhances management's ability to respond to sudden interruptions or bottlenecks in the system by being able to identify alternate manufacturing components to which a process can be diverted.

Figure 10:
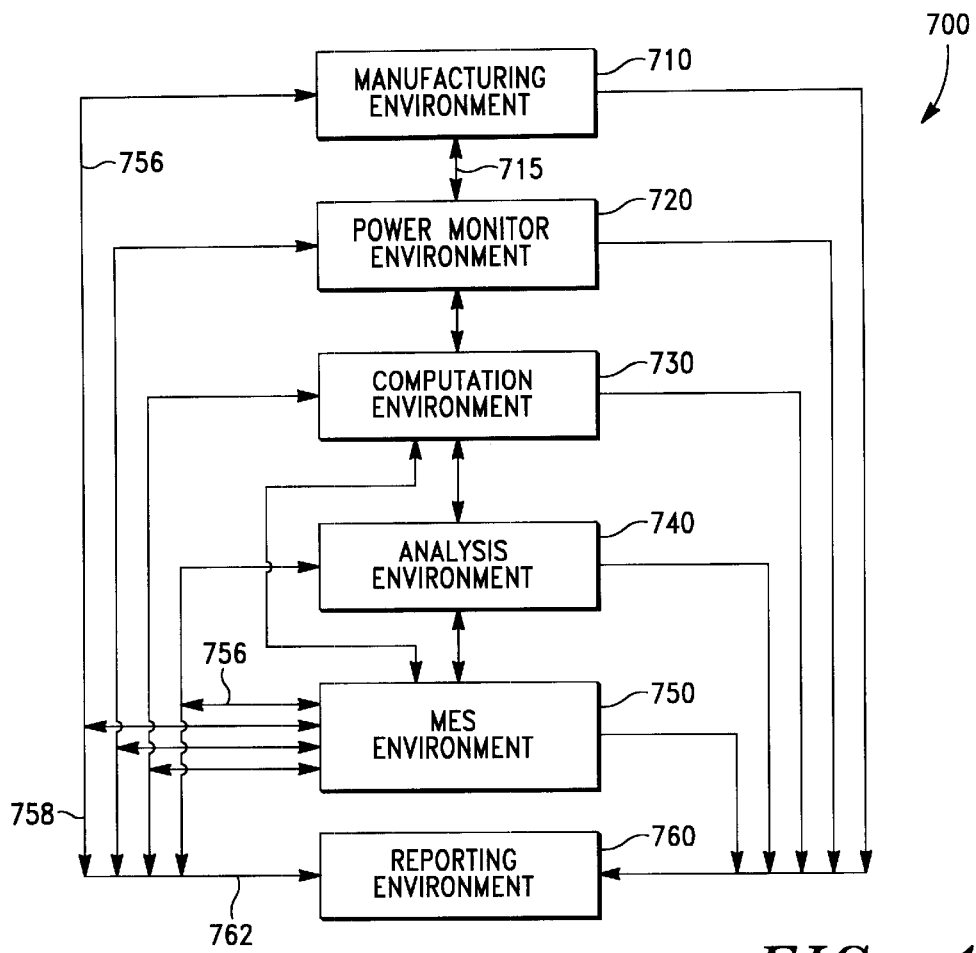
FIG. 10 is a block diagram schematically illustrating a wafer fab employing an lectrical power scheduling system of the present invention.

An additional embodiment of the present invention, schematically illustrated in FIG. 10, shows a wafer fab 700 including an electrical power management system for scheduling and regulating electrical power such that high power demand peaks are avoided. This power management system is integrated with the wafer fab. Wafer fab 700 includes a manufacturing environment 710, a power monitor environment 720, a computation environment 730, an analysis environment 740, an MES environment 750 and a reporting environment 760. The novel electrical power management system comprises: power monitor environment 720, computation environment 730 and analysis environment 740.

Figure 11:
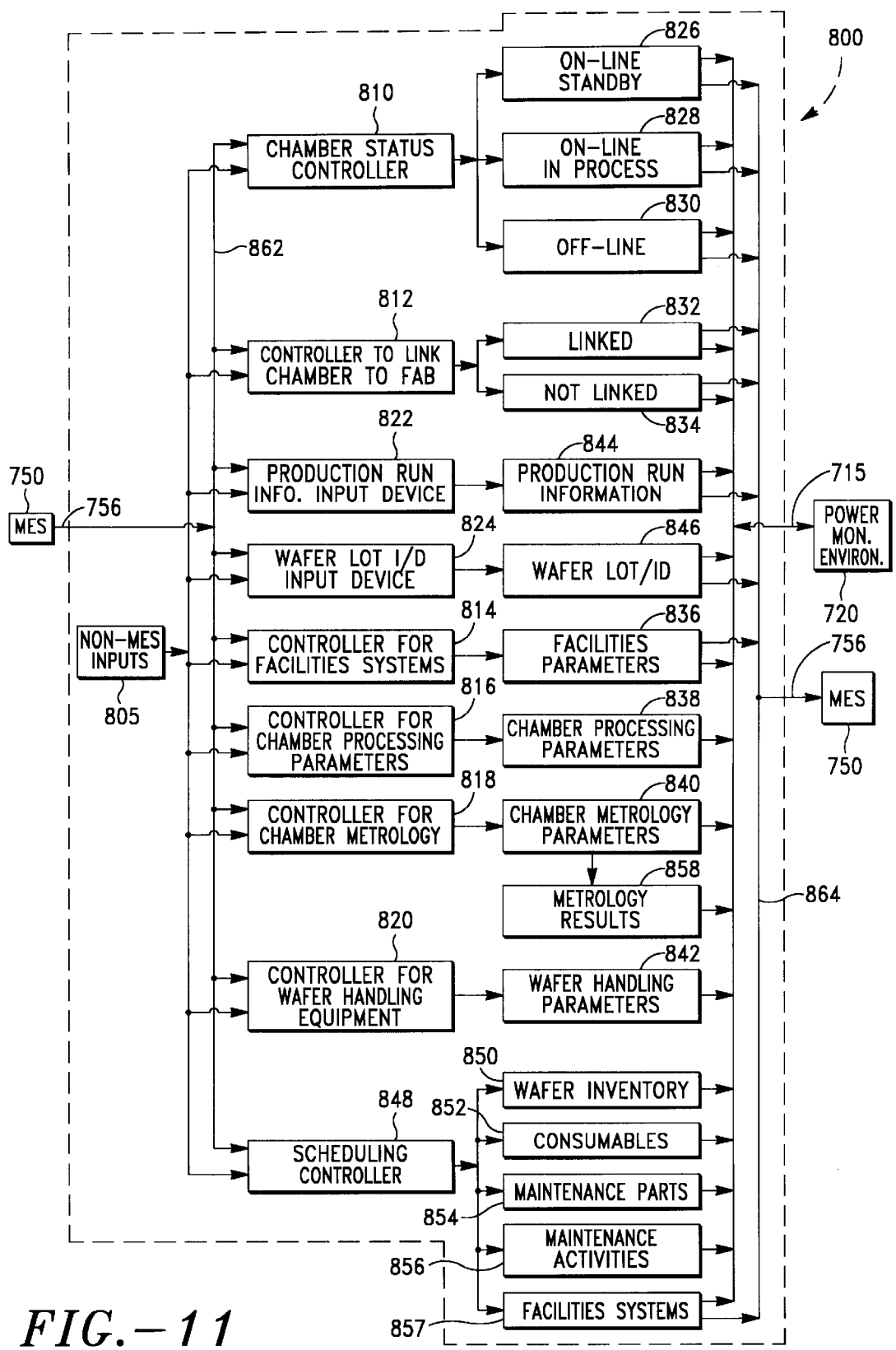
FIG. 11 is a block diagram schematically showing a processing chamber of the afer fab illustrated in FIG. 10.

Manufacturing environment 710 of wafer fab 700 includes the processing tools of the wafer fab such as wafer processing chambers and wafer handling tools, for example wafer handling robots. A wafer processing chamber 800, suitable for use with the novel power management system of the present invention is schematically depicted in FIG. 11. This chamber receives input from MES environment 750 through links 756 and 862. Optionally, chamber 800 can receive additional input through non-MES input 805, for example a response to an alarm signal which is generated by a chamber 800 component. Inputs from MES environment 750 and non-MES input 805 include setting or regulating chamber controllers such as controllers 810, 812, 814, 816, 818 and 820, and providing information to input devices 822 and 824. Based on these inputs, chamber status controller 810 is employed to select the status of the chamber: on-line standby 826, on-line in-process 828 or off-line 830. Controller 812 is utilized to select the chamber status as linked 832 or not linked 834 to the wafer fab system (not shown). Controller 814 controls parameters 836 of the facilities systems, such as electrical power, water and waste product removal. Controller 816 controls chamber processing parameters 838, such as process gas flow rate and pressure. Chamber metrology parameters 840 are controlled by controller 818, these include controlling in-process test parameters such as for example the '297 sputter deposition rate monitor, and test sampling frequency. Wafer handling parameters 842, such as the operational parameters of a wafer handling robot, are controlled by controller 820. Input from MES environment 750 or from non-MES 805 can be utilized to abort a production run using chamber status controller 810 to put the chamber in an off-line status and thereby stop all processing functions of the chamber.

MES environment 750 or non-MES 805 (FIG. 11) can also be utilized to provide production run information 844 by means of production run information input device 822. Such information can include run identification, date or purpose of the run, e.g. testing, production or re-work. Wafer and wafer lot identification 846 in wafer fab chamber 800 can be provided by means of wafer identification input device 824. MES environment 750 additionally provides scheduling inputs to wafer fab chamber 800, such as scheduling input to chamber status controller 810. Also, this environment is an additional input to controller 812 to link the chamber to a wafer fab. Scheduling controller 848, FIG. 11, of chamber 800 receives inputs from MES environment 750 to control wafer inventory 850, consumables 852, maintenance parts 854, maintenance activities 856 and facilities systems scheduling 857 including scheduling the electrical power needed for executing the manufacturing process within the chamber. MES environment 750 coordinates scheduling of various functions or activities. For example, maintenance activities scheduling 856 is coordinated with chamber status controller 810, such as scheduling the status of the chamber off-line 830 for maintenance activities 856 or scheduling wafer inventory 850 and consumables 852 such as process gas in coordination with an on-line in-process status 828. Chamber metrology results 858 can be obtained from the use of test procedures employing chamber metrology parameters 840. These results include for example the rate at which material is flowing from a sputter deposition source to a deposition substrate, as exemplified in the '297 patent.

The various status, parameter, information, metrology and scheduling conditions or results concerning chamber 800 can be transmitted directly to MES environment 750 through links 864 and 756, see FIG. 11, to provide MES environment 750 with comprehensive real time information regarding the chamber's status and processing conditions. This information can also be provided on a real time basis to reporting environment 760 through links 864, 756 and 758 and 762, as illustrated in FIGS. 10 and 11.

Power monitor environment 720, shown in FIGS. 10 and 11, can collect chamber information regarding its status, power usage and power scheduling, as well as processing run and wafer ID information. Optionally, this information is displayed or printed, for example by means of reporting environment 760 as depicted in FIG. 10. Returning to FIG. 11, status information is provided to power monitor environment 720 by on-line standby 826, on-line in process 828, off-line 830, linked 832 and not linked 834. Production run 844 and wafer ID 846 information are transmitted to power monitor environment 720. Power usage information is communicated to power monitor environment 720 by means of facilities parameters 836. Power usage information can include power usage per unit time, cumulative power usage and peak power usage. Monitor environment 720 can receive power scheduling information from chamber 800 facilities systems scheduling 857. Such links as 864 and 715, see FIG. 11, can be employed to transmit information from chamber 800 to power monitor environment 720. Other processing tools, such as additional chambers, (not shown) are similarly linked to MES environment 750 through link 756 and to power monitor environment 720 through link 715, thereby linking a manufacturing environment 710, such as the wafer fab tools, to MES environment 750 and to power monitor environment 720.

Figure 12:
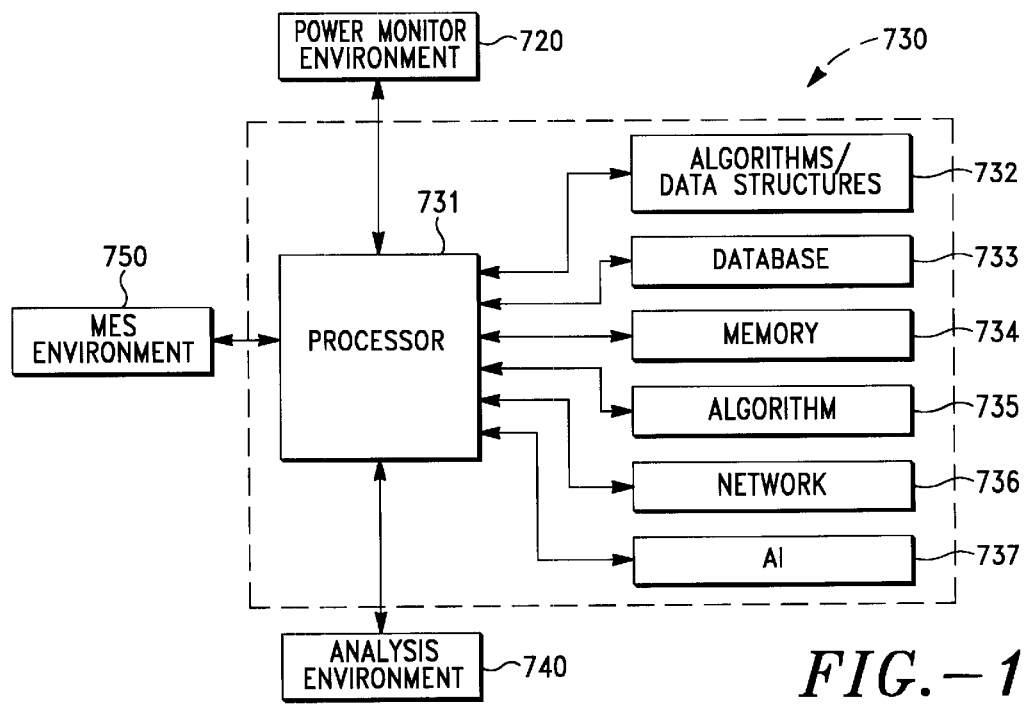
FIG. 12 is a block diagram schematically showing a computation environment of he wafer fab illustrated in FIG. 10.

The wafer fab information collected in power monitor environment 720 is communicated to computation environment 730 depicted in FIGS. 10 and 12. Computation environment 730 is utilized to perform the data processing of information collected in power monitor environment 720. Computation environment 730 typically includes a processor such as a microprocessor 731, see FIG. 12, algorithms or data structures 732, a database 733, a memory 734, a novel algorithm 735, optionally a network component 736 and optionally an AI component 737. Algorithms or data structures 732 are employed using methods which are well known to those of ordinary skill in the art to operate processor 731 and any peripheral devices associated with this processor. Database 733 contains for example historical power usage data. Memory 734 can for example be used to store in-process power usage and power scheduling data.

One or more novel algorithms 735 are employed to assist in implementing the power management system of the wafer fab of manufacturing environment 710. It is well known to those of ordinary skill in the art that electrical power usage of a wafer fab varies during a processing run. For example, if a tool using a furnace is switched on, it typically results in a power surge during start-up of the furnace. However, once the furnace has reached operating temperature it requires less power to operate. Similarly, vacuum pump-down requires more electrical power than maintaining a specific vacuum level. Thus, starting all tools in a wafer fab at the same time generally results in a power surge. Novel algorithm 735 (FIGS. 12 and 13) is adapted for scheduling the usage of tools in the manufacturing environment such that anticipated power surges occur during relative low power usage periods of the wafer fab. For example, pump-down of each of the tools is preferably scheduled such that pump-down is in a planned sequence rather than starting pump-down of several tools simultaneously. Similarly, heating of processing components can be scheduled to avoid simultaneously starting several heaters.

Figure 13:
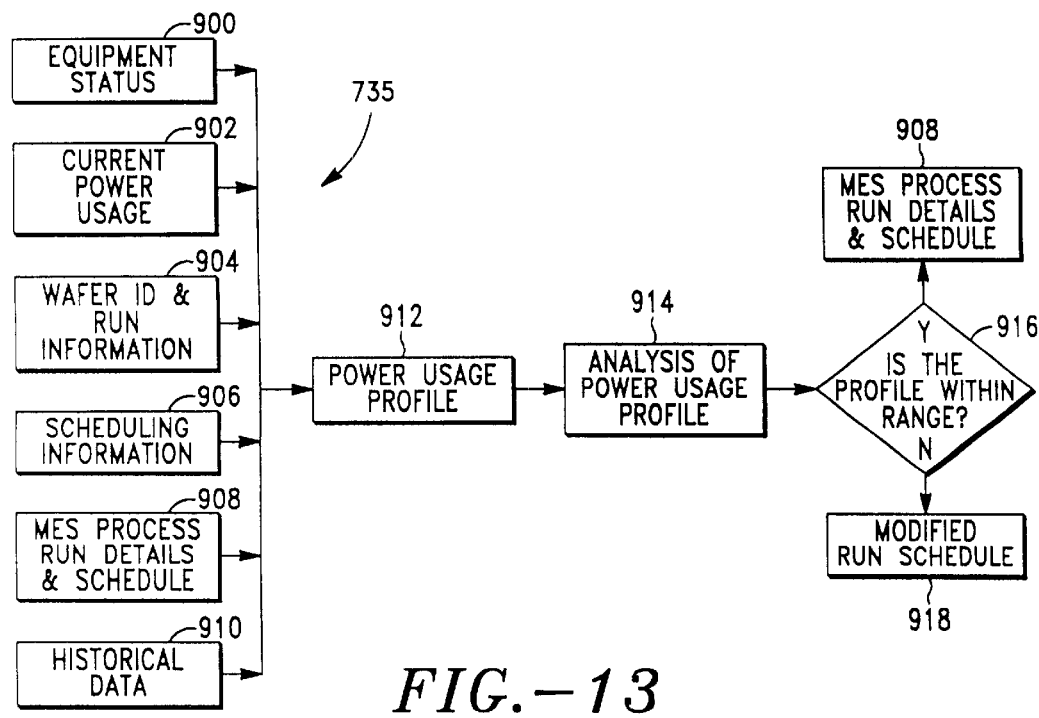
FIG. 13 is an algorithm of the computation environment illustrated in FIG. 12.

Algorithm 735 of the present invention includes the even numbered steps 900 through 918, shown in FIG. 13. Each of these steps includes the pertinent power related information from each of the tools of the wafer fab, thus representing a comprehensive computational treatment of power related information and data concerning the wafer fab. Typically, algorithm 735 is utilized prior to starting a production run, in order to optimize power usage and particularly to avoid power surges and peaks. In step 900, equipment status, including linked or not linked is entered, this can for example include whether all tools of the manufacturing environment are available for a planned production run. Current power usage is entered in step 902, if the process is currently running. Wafer ID and run information are entered in step 904, while scheduling information for the run is entered in step 906. Information entered in steps 900, 902, 904 and 906 is provided by power monitor environment 720. In step 908, MES environment 750 provides process run details to algorithm 735 including the types of tools and the process sequence of using the tools in the manufacturing environment. Historical data concerning power usage of each of the tools scheduled in step 908 are obtained from database 733. These data are entered into step 910 of algorithm 735.

The information provided in steps 900, 902, 904, 906, 908 and 910, depicted in FIG. 13, is combined to derive a power usage profile 912 for the production run. The power usage profile of the actual power usage, or the expected power usage, represents power usage versus time for the entire duration of the wafer fab processing run. Subsequently, in step 914 the power usage profile is analyzed to determine if the anticipated power usage will result in surge or peak consumption periods, i.e. determine whether the profile is within a predetermined power range. This is followed by a decision step 916. If the analysis in step 914 predicts surges or peaks, novel algorithm 735 will reschedule the timing of starting or using tools to avoid these anticipated surges, thus providing a modified wafer fab run schedule in step 918 such that electrical power demand or usage is more evenly distributed during wafer fab processing and wherein power surges remain within a predetermined range. The schedule provided by process run details step in 908 will be executed without modification by algorithm 735, if it is determined in step 916 that the power usage will remain within the predetermined range. A modified wafer fab run schedule, i.e. step 918, will be communicated to the MES environment to automatically activate the various tools of the manufacturing environment according to the schedule developed through algorithm 735. Typically, the manufacturing environment employs one or more on-board computers or distributed computer functions in order to operate or control various processes and operational functions and it will be understood that the MES environment may require special protocols in order to access the manufacturing environment. Alternately, the schedule can be provided to for example reporting environment 760 (FIG. 10) for subsequent intervention in the manufacturing environment. Optionally, algorithm 735 can provide an alert message showing that algorithm 735 was unable to develop a schedule which will maintain power consumption per unit time within a predetermined range.

Optional network component 736 (FIG. 12) of computation environment 730 provides a link between the wafer fab and external entities such as a remote database or a remote management function using for example a bus or a LAN. AI component 737 can for example be used to process historical power usage data stored in database 733 to derive improved algorithms for power usage and power scheduling, based on experience gained over many production runs. Computation environment 730, as described herein, is utilized in conjunction with power monitor environment 720 of the present invention. However, it is also contemplated to use this computation environment for any and all functions of processes carried out in connection with manufacturing environment 710.

As is schematically shown in FIGS. 10 and 12, an analysis environment 740 is provided. This optional environment can be employed to show the results of steps 914 and 916 (FIG. 13) in order to aid in, for example, visual analysis by providing a graphical representation on a computer monitor or as hard copy. While analysis environment 740 has been shown as an environment which is separate from the other environments of this invention, it is also contemplated to integrate analysis environment 740 with computation environment 730. Reporting environment 760, schematically depicted in FIG. 10, can acquire data and information from the environments of the present invention and generate reports as described above in connection with reporting environment 260 shown in FIG. 4.

Figure 14:
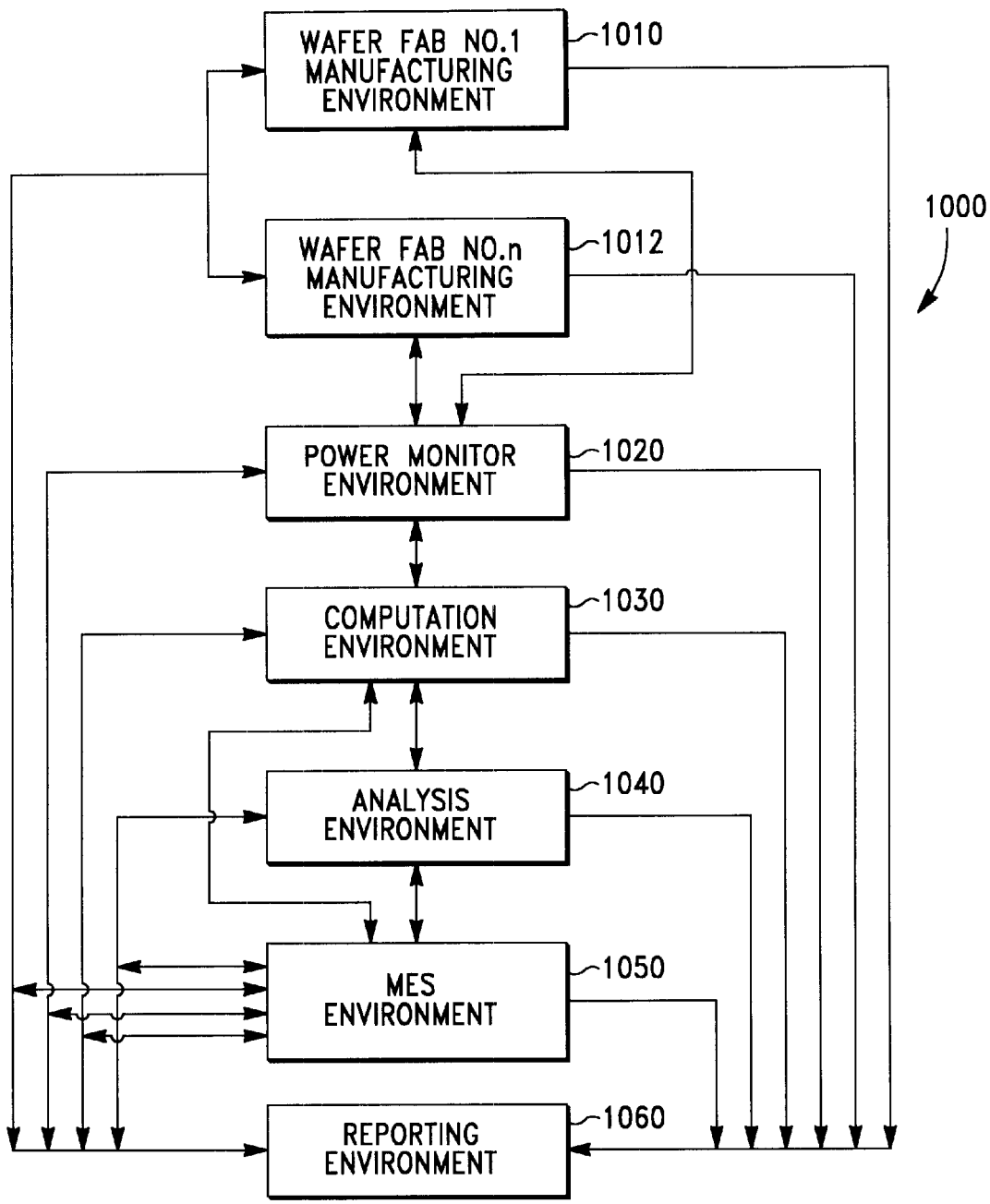
FIG. 14 is a block diagram schematically illustrating multiple wafer fabs employing an electrical power scheduling system of the present invention.

Another embodiment of the present invention, schematically illustrated in FIG. 14, shows an electrical power management system for managing the power of two or more wafer fabs. FIG. 14 depicts a wafer fab system 1000 comprising n wafer fabs which are coordinated for optimum power usage, including a wafer fab No. 1 manufacturing environment 1010, a wafer fab No. n manufacturing environment 1012, a power monitor environment 1020, a computation environment 1030, an analysis environment 1040, an MES environment 1050 and a reporting environment 1060. Manufacturing environments 1010 and 1012 are functionally equivalent to manufacturing environment 710 shown in FIG. 10. Environments 1020, 1030, 1040, 1050 and 1060 of FIG. 14 are functionally equivalent to environments 720, 730, 740, 750 and 760 depicted in FIG. 10. The present embodiment employs a novel algorithm (not shown) similar to algorithm 735 described in connection with FIGS. 12 and 13 in order to optimize electrical power usage such that power peaks or surges are avoided when wafer fab No. 1 and No. n are concurrently used to process semiconductor wafers. While algorithm 735 processes information from one wafer fab and then schedules the various operations in the wafer fab, the algorithm of the system shown in FIG. 14 processes the information from n wafer fabs and then coordinates the schedules of these wafer fabs to avoid power surges and to utilize a processing schedule wherein the electrical power demand or usage is more evenly distributed during wafer fab processing.

The embodiments of the present invention described in connection with FIGS. 10 through 14 provide wafer fab electrical power management systems for one or more wafer fabs, adapted for avoiding power surges and for more evenly distributing the power demand during wafer fab processing. As a consequence, these embodiments have lower circuit breaker ratings, i.e. their maximum power demand is lower than in convention power management systems for wafer fabs. Lower breaker ratings result in capital cost savings because the cost of electrical power equipment such as breakers, transformers and transmission lines is approximately proportional to the system's breaker rating. Also, a more stable electrical power supply results from a more evenly distributed power demand and avoidance of power consumption peaks. The more stable power supply prevents the occurrence of momentary power interruptions or short term brownouts caused by power surges.

Figure 15:
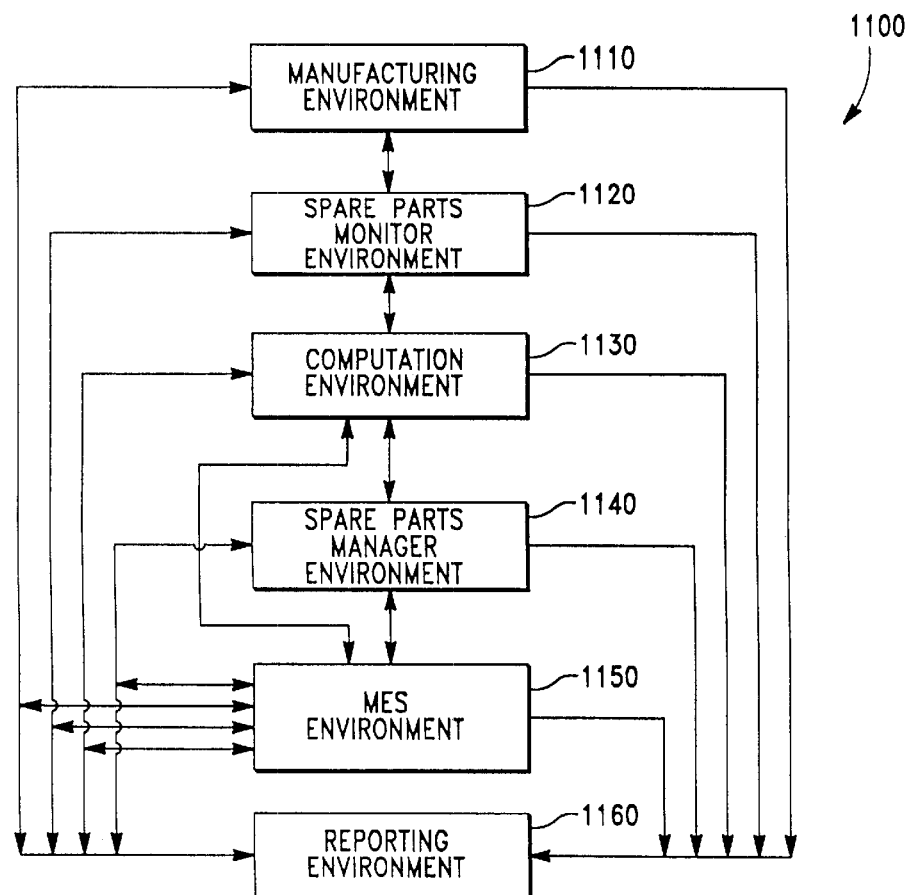
FIG. 15 is a block diagram schematically illustrating a wafer fab employing a spare parts inventory and scheduling system of the present invention.

An additional embodiment of the present invention, schematically illustrated in FIG. 15, shows a wafer fab 1100 including a spare parts inventory control and scheduling system. This spare parts inventory control and scheduling system is integrated with the wafer fab. Wafer fab 1100 includes a manufacturing environment 1110, a spare parts monitor environment 1120, a computation environment 1130, a spare parts manager environment 1140, an MES environment 1150 and a reporting environment 1160. The novel spare parts inventory control and scheduling system comprises: spare parts monitor environment 1120, computation environment 1130 and spare parts manager environment 1140.

Figure 16:
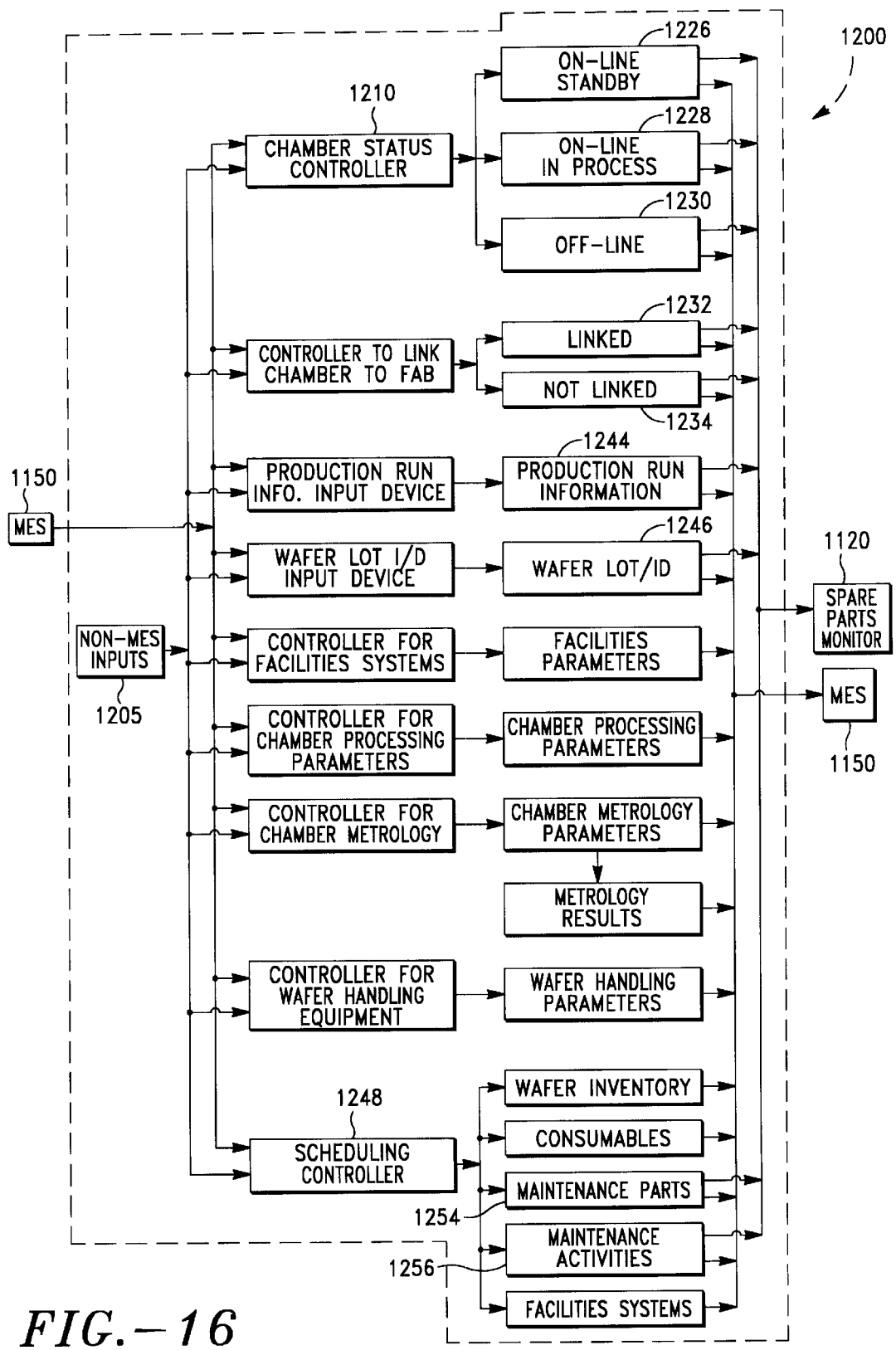
FIG. 16 is a block diagram schematically showing a processing chamber of the wafer fab illustrated in FIG. 15.

Manufacturing environment 1110 of wafer fab 1100 includes the processing tools of the wafer fab such as wafer processing chambers and wafer handling tools. A wafer processing chamber 1200, suitable for use with the novel spare parts inventory and scheduling system is schematically depicted in FIG. 16. This chamber receives input from MES environment 1150. Optionally, chamber 1200 can receive additional input through non-MES input 1205. Inputs from MES environment 1150 and non-MES input 1205 include setting or regulating chamber controllers and providing information to input devices, similar to those described in connection with chamber 800 which is illustrated in FIG. 11. Based on these inputs, chamber controllers and input devices are employed to select the various status, parameter, information and scheduling functions of chamber 1200 similar to those described in connection with chamber 800. The various status, parameter, information, metrology and scheduling conditions or results concerning chamber 1200 can be transmitted directly to MES environment 1150, see FIGS. 15 and 16, to provide MES environment 1150 with comprehensive real time information regarding the chamber's status and processing conditions. This information can also be provided on a real time basis to reporting environment 1160.

Spare parts monitor environment 1120, shown in FIGS. 15 and 16, can collect chamber information regarding its status, spare parts and maintenance scheduling, as well as run and wafer ID information. Optionally, this information is displayed or printed, for example by means of reporting environment 1160 as depicted in FIG. 15. Returning to FIG. 16, status information is provided to spare parts monitor environment 1120 by online standby 1226, on-line in process 1228, off-line 1230, linked 1232 and not linked 1234. Production run 1244 and optionally wafer ID 1246 information are transmitted to spare parts monitor environment 1120. Spare parts, also referred to as maintenance parts, schedule 1254 and maintenance activities schedule 1256 are communicated to spare parts monitor environment 1120, see FIG. 16. Scheduling for spare or maintenance parts is an MES environment activity which can for example be executed through scheduling controller 1248 of wafer fab chamber 1200. Other processing tools, such as additional chambers, (not shown) are similarly linked to MES environment 1150 and to spare parts monitor environment 1120, thereby linking a manufacturing environment 1110, such as the wafer fab tools, to MES environment 1150 and to spare parts monitor environment 1120.

Figure 17:
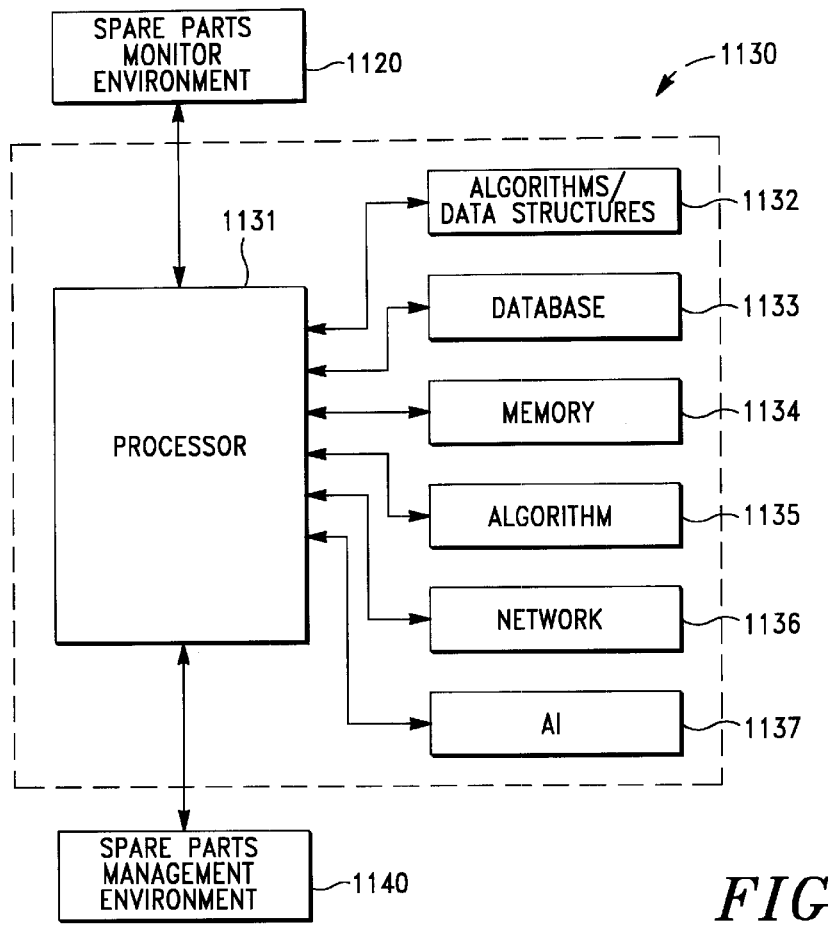
FIG. 17 is a block diagram schematically showing a computation environment of the wafer fab illustrated in FIG. 15.

The wafer fab information collected in spare parts monitor environment 1120 is communicated to computation environment 1130 depicted in FIGS. 15 and 17. Computation. environment 1130 is utilized to perform the data processing of information collected in spare parts monitor environment 1120. Computation environment 1130 typically includes a processor such as a microprocessor 1131, see FIG. 17, algorithms or data structures 1132, a database 1133, a memory 1134, a novel algorithm 1135, a network component 1136 and optionally an AI component 1137. Algorithms or data structures 1132 are employed using methods which are well known to those of ordinary skill in the art to operate processor 1131 and any peripheral devices associated with this processor. Database 1133 contains for example historical data concerning spare parts usage. Memory 1134 can for example be used to store in-process spare parts usage, availability and scheduling data. One or more novel algorithms 1135 are employed to assist in implementing the spare parts management system of wafer fab 1100.

Typically, algorithm 1135 is used well in advance of executing a particular wafer production run in order to make certain that the required spare parts are in inventory. Information regarding the type and quantity of spare parts which are needed for a production run is provided to tool 1200 (FIG. 16) in maintenance parts 1254. The information is obtained from MES environment 1150. The date on which a specific spare part is needed is provided through the scheduling information of maintenance activities 1256 and chamber status controller 1210. The information related to each spare part, is accumulated in spare parts monitor environment 1120, FIG. 15.

Figure 18:
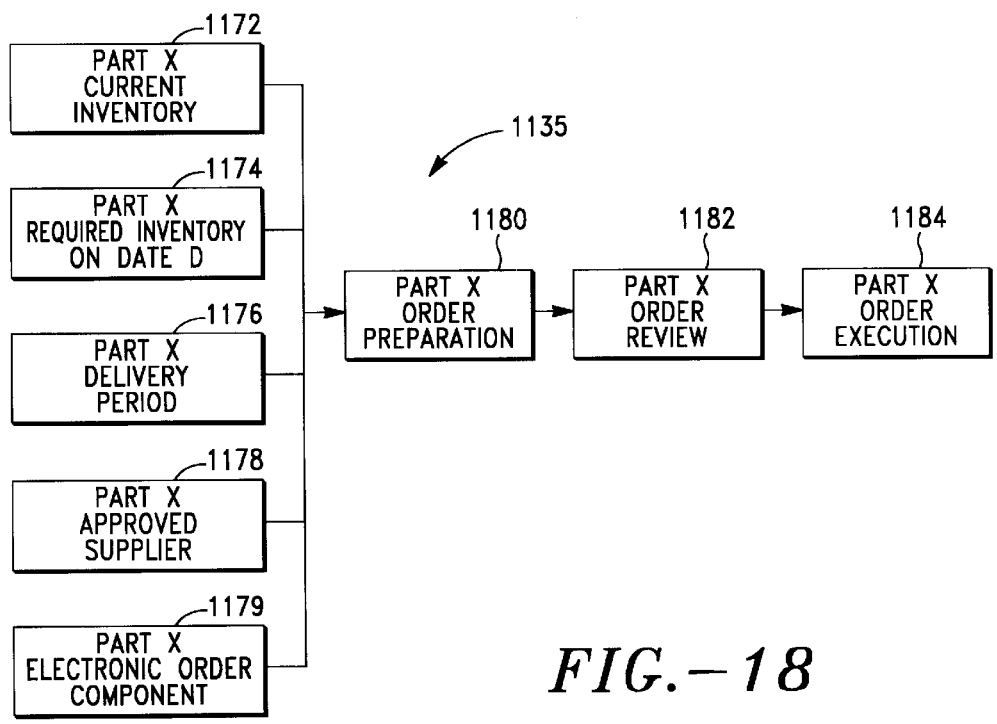
FIG. 18 is an algorithm of the computation environment illustrated in FIG. 17.

Algorithm 1135 of the present invention includes steps 1172, 1174, 1176, 1178, 1179, 1180, 1182 and 1184, illustrated in FIG. 18, as exemplified for a part designated X. The current inventory of part X for wafer fab 1100 is automatically entered by spare parts monitor environment 1120 (FIG. 17) in step 1172. The required inventory which is needed on a scheduled date, such as a date scheduled for maintenance, is entered by spare parts environment 1120 in step 1174. A required delivery date D is calculated in step 1174 by, for example, subtracting a predetermined number of days from the scheduled date in order to achieve delivery just prior to needing the part. Optionally, the delivery period for part X, i.e. the time required to receive the part following ordering the part from the approved supplier, can be entered automatically by spare parts manager environment 1140 (FIG. 17) in step 1176. The approved supplier is entered automatically by spare parts manager environment 1140 in step 1178 of algorithm 1135 shown in FIG. 18. An electronic order component, step 1179, is provided to algorithm 1135 by spare parts manager environment 1140 which provides information for electronically transmitting a parts order to the approved supplier, for example using e-mail. Algorithm 1135 prepares a purchase order for part X by combining the information from steps 1172, 1174, 1176, 1178 and 1179. The order is electronically communicated to the spare parts manager environment for an optional review, step 1182, of the purchase order. Subsequently, in step 1184 the purchase order for part X is then executed by transmitting it electronically to the supplier, using the electronic order component of step 1179. This step can for example be executed through network 1136, FIG. 17, of computation environment 1130. Inventory for other parts is scheduled and ordered similarly, using algorithm 1135. 1176. The approved supplier is entered automatically by spare parts manager environment 1140 in step 1178 of algorithm 1135 shown in FIG. 18. An electronic order component, step 1179 is provided to algorithm 1135 by spare parts manager environment 1140 which provides information for electronically transmitting a parts order to the approved supplier, for example using e-mail. Algorithm 1135 prepares a purchase order for part X by combining the information from steps 1172, 1174, 1176, 1178 and 1179. The order is electronically communicated to the spare parts manager environment for an optional review, step 1182, of the purchase order. Subsequently, in step 1184 the purchase order for part X is then executed by transmitting it electronically to the supplier, using the electronic order component of step 1179. This step can for example be executed through network 1136, FIG. 17, of computation environment 1130. Inventory for other parts is scheduled and ordered similarly, using algorithm 1135.

While the invention has been illustrated in connection with one wafer fab, the invention is equally suitable for use with several wafer fabs by combining the spare parts information from the manufacturing environments of these wafer fabs in one spare parts monitor and using the algorithm for electronically deriving and executing a purchase order.

SPC techniques, such as those described in connection with FIGS. 3–9 can also be used to identify processing, product or quality problems requiring repair or maintenance action of a wafer fab tool. Statistical information regarding the need for spare parts, based on these SPC techniques can be provided by the MES environment to maintenance parts 1254 and maintenance activities 1256 of chamber 12, shown in FIG. 16. This SPC derived information is then an added component of the spare parts requirements which is provided to the spare parts monitor environment.

Network component 1136 (FIG. 17) of computation environment 1130 provides a link between the wafer fab and external entities such as a remote database or a remote management function using for example a bus or an internet connection to electronically execute the spare parts order as described above in connection with algorithm 1135. AI component 1137 can for example be used to process historical spare parts usage data stored in database 1133 to derive improved algorithms for spare parts scheduling and ordering, based on experience gained over many production runs. Computation environment 1130, as described herein, is utilized in conjunction with spare parts monitor environment 1120 of the present invention. However, it is also contemplated to use this computation environment for any and all functions of processes carried out in connection with manufacturing environment 1110. Spare parts management environment 1140, see FIGS. 15 and 17, has been shown as an environment which is separate from the other environments of this invention. However, it is also contemplated to integrate spare parts management environment 1140 with computation environment 1130 or with MES environment 1150. Reporting environment 1160, schematically depicted in FIG. 15, can acquire data and information from the environments of the present invention and generate reports as described above in connection with reporting environment 260 shown in FIG. 4.

Figure 19:
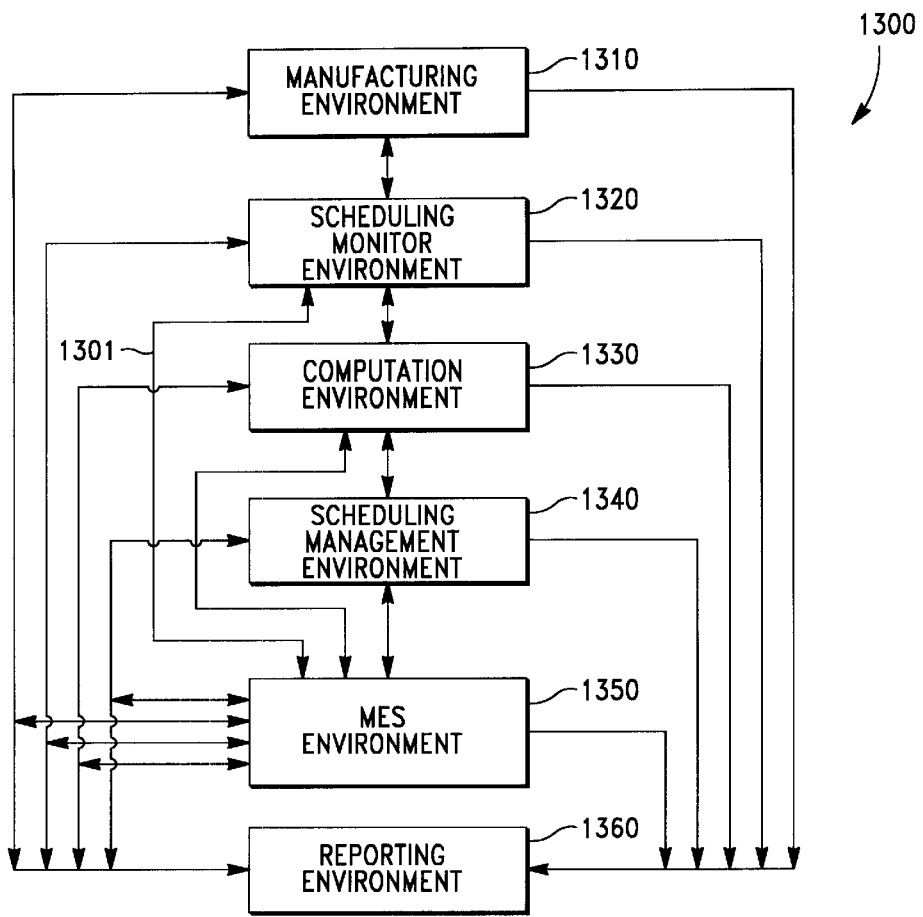
FIG. 19 is a block diagram schematically illustrating a wafer fab employing a wafer fab efficiency system of the present invention.

The novel spare parts inventory control and scheduling system is adapted for managing spare parts on a JIT (just-in-time) basis, i.e. parts are delivered by the supplier when they are expected to be needed, and no sooner. JIT inventory control generally results in reduced wafer production cost because spare parts purchases are made on an asneeded basis, and the need for spare parts storage space is minimized. An additional embodiment of the present invention, schematically illustrated in FIG. 19, shows a wafer fab 1300 including a wafer fab efficiency system. This wafer fab efficiency system is integrated with the wafer fab. Wafer fab 1300 includes a manufacturing environment 1310, a scheduling monitor environment 1320, a computation environment 1330, a scheduling management environment 1340, an MES environment 1350 and a reporting environment 1360. The novel wafer fab efficiency system comprises: scheduling monitor environment 1320, computation environment 1330 and scheduling management environment 1340. MES environment 1350. Optionally, chamber 1400 can receive additional input through non-MES input 1405. Inputs from MES environment 1350 and non-MES input 1405 include setting or regulating chamber controllers, using chamber status controller 1410, and providing information to input devices, similar to those described in connection with chamber 800 which is illustrated in FIG. 11. Based on these inputs, chamber controllers and input devices are employed to select the various status, parameter, information and scheduling functions of chamber 1400 similar to those described in connection with chamber 800. The various status, parameter, information, metrology and scheduling conditions or results concerning chamber 1400 can be transmitted directly to MES environment 1350, see FIGS. 19 and 20, to provide MES environment 1350 with comprehensive real time information regarding the chamber's status and processing conditions. This information can also be provided on a real time basis to reporting environment 1360 depicted in FIG. 19.

Optionally, MES environment 1350, FIG. 19, provide scheduling monitor environment 1320 with a personnel schedule for operating the wafer fab, including for example the manufacturing group, the maintenance group, wafer fab management as well as support personnel. This information can be conveyed to scheduling monitor environment 1320 using for example link 1301 shown in FIG.19.

Figure 21:
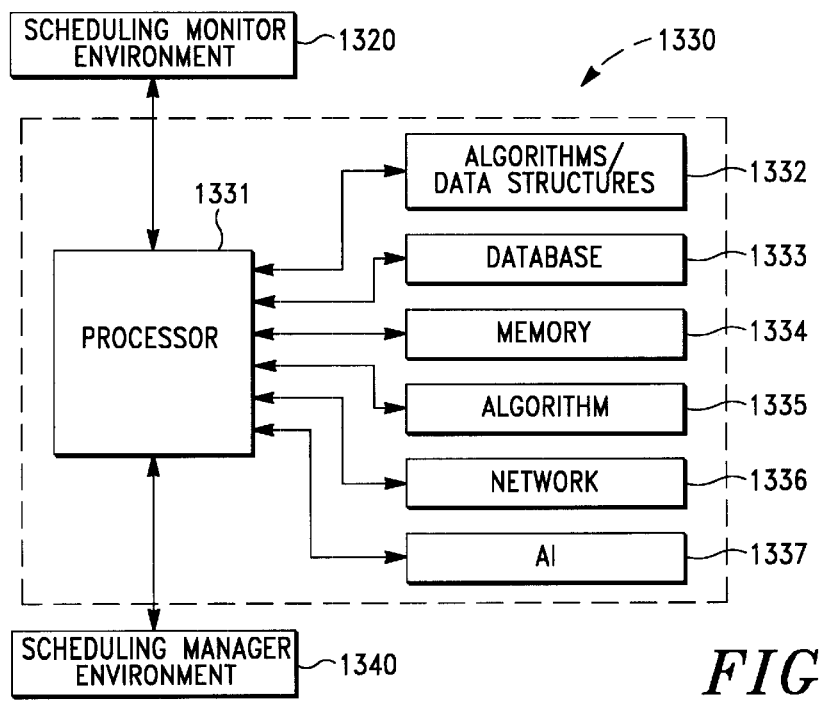
FIG. 21 is a block diagram schematically showing a computation environment of the wafer fab illustrated in FIG. 19.

The wafer fab information collected in scheduling monitor environment 1320 is communicated to computation environment 1330 depicted in FIGS. 19 and 21. Computation environment 1330 is utilized to perform the data processing of information collected in scheduling monitor environment 1320. Computation environment 1330 typically includes a processor such as a microprocessor 1331, see FIG. 21, algorithms or data structures 1332, a database 1333, a memory 1334, a novel algorithm 1335, optionally a network component 1336 and optionally an AI component 1337. Algorithms or data structures 1332 are employed, using methods which are well known to those of ordinary skill in the art, to operate processor 1331 and any peripheral devices associated with this processor. Database 1333 contains for example historical data concerning wafer fab scheduling, and scheduling of wafer fab tools. Memory 1334 can for example be used to store in-process scheduling data. One or more novel algorithms 1335 are employed to assist in implementing the wafer fab efficiency system of wafer fab 1300.

Figure 22:
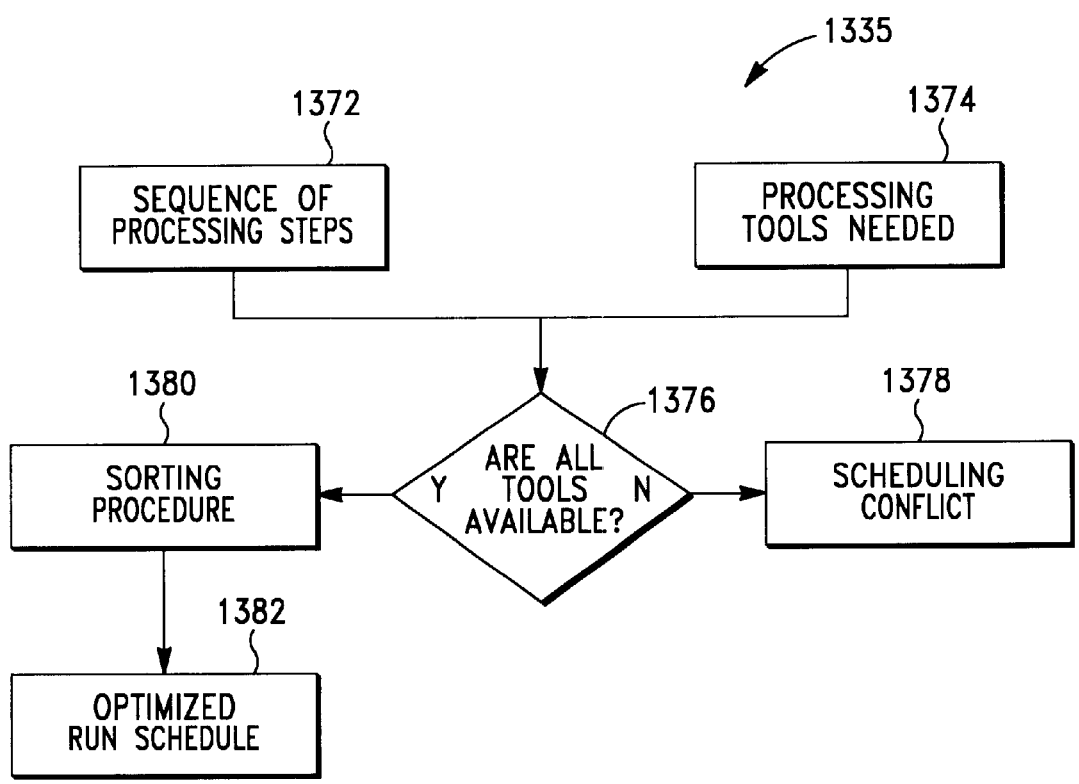
FIG. 22 is an algorithm of the computation environment illustrated in FIG. 21.

Algorithm 1335 of the present invention is utilized to optimize the wafer fab process for improved asset utilization. This algorithm includes the even numbered steps 1372–1382, as illustrated in FIG. 22. In step 1372, the sequence of all processing steps for executing the wafer fab process is entered. This sequence can for example be obtained from a wafer fab design which has not yet been used in actual production, from a test run, or from a prior production run for this wafer fab. The sequence information is generally obtained from MES environment 1350. Alternatively, the sequence information resulting from a previous production run can be obtained from database 1333, see FIG. 21. Returning to FIG. 22, all processing tools which are needed for the required processing steps, and which are available to be on-line with wafer fab 1300, are entered in step 1374. The information needed in step 1374 can for example be obtained from database 1333 or from MES environment 1350. Decision step 1376 determines whether the required tools are available. If they are not available, algorithm 1335 will indicate a scheduling conflict in step 1378 and for example communicates this conflict to MES environment 1350 or to scheduling management environment 1340 shown in FIG. 19.

If there is no scheduling conflict, an optimizing procedure will be executed in step 1380 to optimize the use of the processing tools and any required equipment and services for executing wafer fab 1300. This optimizing procedure takes into account the wafer capacity in terms of wafers processed per unit time to determine for example if additional processing tools are needed in order to employ certain types of processing tools in parallel. The optimizing procedure can also include implementing an electrical power management system such as described in connection with FIGS. 10–13. An optimized process run schedule is obtained in step 1382 as a result of the optimizing procedure of step 1380. The optimized run schedule is communicated to scheduling management environment 1340 (FIG. 19) which then provides additional scheduling for example for personnel, facilities and materials.

While the invention has been illustrated in connection with one wafer fab, the invention is equally suitable for use with several wafer fabs by employing an algorithm, such as algorithm 1335 of the present invention, to optimize the scheduling of the available processing tools for use with these wafer fabs in order to achieve improved wafer fab efficiency.

Network component 1336 (FIG. 21) of computation environment 1330 provides a link between the wafer fab and external entities such as a remote database or a remote management function using for example a bus or an internet connection. The network component can also provide a link between several wafer fabs in order to coordinate the scheduling of these wafer fabs. AI component 1337 can for example be used to process historical wafer fab process run and tool data stored in database 1333 to derive improved algorithms for optimizing wafer fab processes based on experience gained over many production runs. Computation environment 1330, as described herein, is utilized in conjunction with scheduling monitor environment 1320 of the present invention. However, it is also contemplated to use this computation environment for any and all functions of processes carried out in connection with wafer fab 1300. Scheduling management environment 1340, see FIGS. 19 and 21, has been shown as an environment which is separate from the other environments of this invention, it is also contemplated to integrate scheduling management environment 1340 with computation environment 1330 or with MES environment 1350. Reporting environment 1360, schematically depicted in FIG. 19, can acquire data and information from the environments of the present invention and generate reports as described above in connection with reporting environment 260 shown in FIG. 4.

The novel wafer fab efficiency system is adapted for the more efficient scheduling of wafer fab resources, leading to a more efficient wafer flow, thereby maximizing die output and wafer fab utilization, resulting an improved asset utilization. The improved asset utilization results in more efficient use of resources such as equipment, materials, facilities and personnel, and in reduced manufacturing costs.

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims. I claim:

I claim:

1. An apparatus for scheduling a plurality of processing tools in IC fabrication including at least one tool that is not incorporated in a cluster tool, the apparatus comprising:

a) a scheduling monitor environment adapted for automatically collecting information regarding status and scheduling from the plurality of processing tools, wherein the plurality of tools comprises at least one tool that is not incorporated in a cluster tool; and b) a computation environment adapted for: (1) obtaining a first sequence for using the plurality of processing tools, (2) incorporating the information regarding status and scheduling in the first sequence and (3) developing a second sequence for using the plurality of processing tools and additionally comprising an algorithm for developing the second sequence, wherein the plurality of tools comprises at least one tool that is not incorporated in a cluster tool.

2. A method for scheduling a plurality of processing tools in IC fabrication, the method comprising:

a) identifying the plurality of processing tools, wherein the tools include at least one processing tool that is not incorporated in a cluster tool;

b) obtaining a first sequence for using the plurality of processing tools in the IC fabrication;

c) automatically collecting processing tool information regarding each of the plurality of processing tools; and d) developing a second sequence by incorporating the processing tool information into the first sequence.

3. The method of claim 2, wherein tool information comprises:

a) processing tool status;

b) scheduling of tool activities;

c) tool scheduling of materials; and d) tool IC run information.

4. The method of claim 3 wherein the tool status information comprises:

a) tool on-line standby status information;

b) tool on-line in process status information;

c) tool off-line status information;

d) tool linked status information; and e) tool not linked status information.

5. A method for scheduling a plurality of processing tools in a wafer fabrication efficiency system including at least one tool that is not incorporated in a cluster tool, the method comprising:

a) identifying the plurality of processing tools wherein at least one processing tool is not incorporated in a cluster tool;

b) obtaining a first sequence for using the plurality of processing tools in the wafer fabrication efficiency system;

c) automatically collecting processing tool information regarding each of the plurality of processing tools; and d) developing a second sequence by incorporating the processing tool information into the first sequence.

6. The method of claim 5 wherein tool information includes:

a) processing tool status;

b) scheduling of tool activities;

c) tool scheduling of consumables; and d) tool wafer run information.

7. The method of claim 6 wherein processing tool status information comprises:
   a) tool on-line standby status information;
   b) tool on-line in process status information;
   c) tool off-line status information;
   d) tool linked status information; and
   e) tool not linked status information.

8. The method of claim 5 wherein the method additionally comprises:
   a) selecting a personnel schedule for operating the system; and
   b) automatically including the personnel schedule in the processing tool information.'

9. A method for scheduling a plurality of processing tools in a wafer fabrication efficiency system, the method comprising:
   a) identifying the plurality of processing tools;
   b) obtaining a first sequence for using the plurality of processing tools in the wafer fabrication efficiency system;
   c) automatically collecting processing tool information regarding each of the plurality of processing tools; and
   d) developing a second sequence by incorporating the processing tool information into the first sequence, wherein developing the second sequence comprises employing an algorithm including: (1) determining a third sequence of processing steps for executing the system, (2) determining whether the plurality of identified processing tools are available for the system, (3) concluding a scheduling conflict for the system if the processing tools are not available, and (4) executing an optimizing procedure for optimizing processing tool usage if the processing tools are available.

10. A method for scheduling a plurality of processing tools in a wafer fabrication efficiency system, the method comprising:
    a) identifying a first plurality of processing tools of a first wafer fab;
    b) identifying at least a second plurality of processing tools of an at least second wafer fab;
    c) obtaining a first sequence for using the first and the at least second pluralities of processing tools in the system;
    d) automatically collecting processing tool information regarding each of the first and the at least second pluralities of processing tools; and
    e) developing a second sequence by incorporating the processing tool information into the first sequence.

11. The apparatus of claim 1 wherein the algorithm comprises:
    a) determining a third sequence of processing steps for executing the IC fabrication;
    b) determining whether the plurality of identified processing tools are available for the IC fabrication;
    c) concluding a scheduling conflict for the IC fabrication if the processing tools are not available; and
    d) executing an optimizing procedure for optimizing processing tool usage if the processing tools are available.

12. The apparatus of claim 1 wherein the information regarding the status of the plurality of processing tools comprises:
    a) tool on-line standby status information;
    b) tool on-line in process status information;
    c) tool off-line status information;
    d) tool linked status information; and
    e) tool not linked status information.

13. An apparatus for scheduling a plurality of processing tools in IC fabrication, the apparatus comprising:
    a) a scheduling monitor environment adapted for automatically collecting information regarding status and scheduling from the plurality of processing tools, wherein the tools include at least one processing tool that is not incorporated in a cluster tool; and
    b) a computation environment adapted for: (1) obtaining a first sequence for using the plurality of processing tools, (2) incorporating the information regarding status and scheduling in the first sequence and (3) developing a second sequence for using the plurality of processing tools.

14. An apparatus for scheduling a plurality of processing tools in a wafer fabrication efficiency system including at least one tool that is not incorporated in a cluster tool, the apparatus comprising;
    a) a scheduling monitor environment adapted for automatically collecting information regarding status and scheduling from the plurality of processing tools, wherein the tools include at least one processing tool that is not incorporated in a cluster tool; and
    b) a computation environment adapted for: (1) obtaining a first sequence for using the plurality of processing tools, (2) incorporating the information regarding status and scheduling in the first sequence and (3) developing a second sequence for using the plurality of processing tools.

* * * * *